(12) United States Patent
Hur et al.

(10) Patent No.: US 6,639,854 B2
(45) Date of Patent: Oct. 28, 2003

(54) REDUNDANCY CIRCUIT OF SEMICONDUCTOR MEMORY DEVICE

(75) Inventors: Young Do Hur, Chungcheongbuk-do (KR); Jong Chern Lee, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 37 days.

(21) Appl. No.: 10/020,168

(22) Filed: Dec. 18, 2001

(65) Prior Publication Data

US 2002/0176287 A1 Nov. 28, 2002

(30) Foreign Application Priority Data

May 25, 2001 (KR) ........................................ 2001-29101

(51) Int. Cl.⁷ ................................................ G11C 7/00
(52) U.S. Cl. ........................ 365/200; 365/201; 365/236; 365/189.05
(58) Field of Search ................................ 365/200, 201, 365/236, 225.7, 189.05, 230.06, 230.08

(56) References Cited

U.S. PATENT DOCUMENTS 5,561,636 A  * 10/1996 Kirihata et al. ............. 365/201

* cited by examiner

Primary Examiner—David Lam
(74) Attorney, Agent, or Firm—Birch, Stewart, Kolasch & Birch, LLP.

(57) ABSTRACT

A semiconductor memory device having a redundancy circuit, includes a normal memory cell array unit, a redundancy memory cell array unit for recovering defective cells of the normal memory cell array unit, and a memory driving unit for operating the normal memory cell adjacent to the redundancy memory cell array unit immediately after a word line move time 'tcycle' is elasped by using address data.

32 Claims, 21 Drawing Sheets

US 6,639,854 B2

REDUNDANCY CIRCUIT OF SEMICONDUCTOR MEMORY DEVICE

RELATED APPLICATION

The present application claims the benefit of Korean Patent Application No. 2001-29101 filed on May 25, 2001, which is herein fully incorporated by reference.

BACKGROUND OF THE INVENTION

1. Field of the Invention

The present invention relates to a semiconductor memory device and, more particularly, to a semiconductor memory device having a redundancy circuit capable of detecting deterioration by interference of normal memory cell and redundancy memory cell while reducing detection time.

2. Description of the Related Art

FIG. 1 shows a conventional semiconductor memory device having a redundancy circuit with 64M bit capacitance. Referring to FIG. 1, the conventional semiconductor memory device having the redundancy circuit comprises: a memory cell array unit 50 of 64M bit for storing a plurality of data; a redundancy memory cell array unit 52 of 1K for recovering defective cells of the memory cell array unit 50; and a sense amplification and I/O (input/output) control unit(s) 54 for sensing and amplifying read data received from the memory cell array unit 50 or from the redundancy memory cell array unit 52 and then outputting the amplified data to an I/O line or for sensing and amplifying write data received through the I/O line and then outputting the amplified data to the memory cell array unit 50 or to the redundancy memory cell array unit 52.

The conventional semiconductor memory device further comprises: an address buffer unit 10 for receiving address signals A0~A12 from an external source; a row address counter unit 12 for generating row address counter signals AR<0:12>; a row address buffer unit 14 for receiving the address signals A<0:12> from the address buffer unit 10 and the row address counter signals AR<0:12> from the row address counter unit 12 and generating row address data signals BXB<0:12>; a row predecoder unit 16 for receiving the row address data signals BXB<0:12> from the row address buffer unit 14 and generating decoded signals; and a row decoder unit 18 for decoding signals received from the row predecoder unit 16 and generating signals WL<0:8191> to select word lines of the memory cell array unit 50.

The conventional semiconductor memory device further comprises: a command buffer unit 26 for receiving command signals i.e., row address strobe bar signal RASB, column address strobe bar signal CASB, write enable bar signal WEB, output enable bar signal OEB from external source(s); a command control unit 28 for receiving signals from the command buffer unit 26; and a test mode control unit 30 for receiving signals from the command control unit 28 and the address signals A<0:12> from the address buffer unit 10 and generating test mode signals TRATX, TRATY to detect deterioration in word lines and bit lines of the redundancy memory cell array unit 52.

The conventional semiconductor memory device further comprises: a row redundancy predecoder unit 20 for receiving row address data signals BXB<0:2> from the address buffer unit 14 and the test mode signals TRATX from the test mode control unit 30 and generating decoded signals TREB<0:7>; a row redundancy fuse unit 22 for generating signals REB<0:7> by programming row redundancy data; and a row redundancy enable signal generating unit 24 for receiving the decoded signals TREB<0:7> from the row redundancy predecoder unit 20 and the signals REB<0:7> from the row redundancy fuse unit 22 and generating signals RWL<0:7> to select word lines of the redundancy memory cell array unit 52.

The conventional semiconductor memory device further comprises: a column address buffer unit 32 for receiving address signals A<0:8> from the address buffer unit 10 and generating column address data signals BYB<0:8>; a column predecoder unit 34 for receiving column address data signals BYB<0:7> from the column address buffer unit 32 and generating decoded signals; and a column decoder unit 36 for receiving the decoded signals from the column predecoder unit 34, generating signals YS<0:255> to select bit lines of the memory cell array unit 50 and outputting the signals YS<0:255> to the sense amplification and I/O control unit 54.

The conventional semiconductor memory device still further comprises: a column redundancy predecoder unit 38 for receiving a column address data signal BYB<0> from the column address buffer unit 32 and the test mode signals TRATY from the test mode control unit 30 and generating decoded signals TYREB<0:1>; a column redundancy fuse unit 40 for generating signals YREB<0:1> by programming column redundancy data; and a column redundancy enable generating unit 42 for receiving the decoded signals TYREB<0:1> from the column redundancy predecoder unit 38 and the signals YREB<0:1> from the column redundancy fuse unit 40, generating signals RYS<0:1> to select bit lines of the redundancy memory cell array unit 52, and outputting the signals RYS<0:1> to the sense amplification and I/O control unit 54.

FIG. 2 is a circuit diagram of a part of the conventional row address buffer unit 14 for receiving the highest row address A<12> in FIG. 1. As shown in FIG. 2, the row address buffer unit 14 comprises: an inverter 141 for receiving signals BP4K outputted from a command decoder (not shown) in a refresh operation; an inverter 142 for inverting signals received from the inverter 141; an NMOS transistor Ni for discharging electric potential of a node Nd1 that receives the highest row address signal AK<12> from the address buffer unit 10 according to the signals received from the inverter 142 to the ground voltage Vss; a PMOS transistor P1 for transmitting a source voltage Vcc to a node Nd2 when the signal of the node Nd1 is at a low level; a PMOS transistor P2 connected to the PMOS transistor P1 in a row for applying the source voltage Vcc to its gate; NMOS transistors N2, N3 connected between the node Nd2 and the ground voltage Vss and their operation being controlled by signals of the source voltage Vcc and the node Nd1; an inverter 143 for inverting control signals XLAT; a clock inverter 144 for receiving signals of the node Nd2 according to the control signals XLAT being active at a high level in all operations except for refresh and outputting the inverted signals to a node Nd3; an inverter 145 for receiving signals of the node Nd3 and outputting the inverted signals to a node Nd4; an inverter 146 for receiving signals of the node Nd4 and outputting the inverted signals to the node Nd3; a clock inverter 148 for outputting the highest row address signal AR<12> received from the row address counter unit 12 to the node Nd3 according to control signal RLAT being active at a high level in a refresh operation; PMOS transistors P3, P4 connected between the source voltage Vcc and a node Nd5 in series and their operation being controlled by the ground voltage Vss and the node Nd4; an NMOS transistor N4 connected between the node Nd5 and a node Nd6 and its operation being controlled by signals of the node Nd4; an inverter 149 for receiving signals BP4K outputted from a command decoder (not shown) in a refresh operation and outputting the inverted signals; an inverter 150 for inverting and outputting signals received from the inverter 149; a NOR gate 151 for receiving signals received from the inverter 150 and the ground voltage Vss and outputting signals according to its NOR logic operation; a PMOS transistor P5 connected between the source voltage Vcc and the node Nd5 and for applying output signals of the NOR gate 151 to the gate; NMOS transistors N5, N6 connected between the node Nd5 and the ground voltage Vss in series and their operation being controlled by the ground voltage Vss and the output signals of the NOR gate 151; and an inverter 152 for inverting signals received from the node Nd5 and outputting them as the row address data signal BXB<12>.

In the highest row address buffer having the above-mentioned structure, the signal BP4K outputted from the command decoder is at a low level, the control signal RLAT is at a low level and the control signal XLAT is at a high level in a normal operation, thereby latching the highest row address signal A<12> received from the address buffer unit 10 and outputting the latched signal as the highest row address data signal BXB<12>.

On the other hand, in a 4K refresh operation, the signal BP4K outputted from the command decoder is at a high level, the control signal RLAT is at a high level and the control signal XLAT is at a low level. Therefore, in the 4K refresh operation, the highest row address buffer is not used since the electric potential of the node Nd1 for receiving the highest row address signal A<12> from the address buffer unit 10 is discharged to the ground Vss by the NMOS transistor N1, and the NMOS transistor N6 connected to the output terminal is turned off by the output signal of the NOR gate 151. At this time, the output signal BXB<12> of the highest row address buffer is at a low level.

In a 8K refresh operation, the signal BP4K outputted from the command decoder is at a low level, the control signal RLAT is at a high level and the control signal XLAT is at a low level. The highest row address signal AR<12> received from the row address counter unit 12 is transmitted to the node Nd3 through the clock inverter 148 operated by the high control signal RLAT. The highest row address signal AR<12> received from the row address counter unit 12 and transmitted to the node Nd3 is latched by the inverters 145, 146 and the latched highest row address signal AR<12> received from the row address counter unit 12 is outputted as the highest row address data signal BXB<12> through the output terminal.

FIG. 3 is a circuit diagram of the conventional row redundancy predecoder unit 20 in FIG. 1. As shown in FIG. 3, the row redundancy predecoder unit 20 includes: an inverter 204 for receiving a row address data signal BXB<0> received from the row address buffer unit 14 and outputting the inverted signal; an inverter 205 for inverting and outputting signals received from the inverter 204; an inverter 206 for receiving a row address data signal BXB<1> received from the row address buffer unit 14 and outputting the inverted signal; an inverter 207 for inverting and outputting the signal received from the inverter 206; an inverter 208 for receiving a row address data signal BXB<2> received from the row address buffer unit 14 and outputting the inverted signal; an inverter 209 for inverting and outputting the signal received from the inverter 208; a NAND gate 210 for receiving signals from the inverters 204, 206, 208 and outputting signals generated according to its NAND logic operation; a NAND gate 211 for receiving signals from the inverters 205, 206, 208 and outputting signals generated according to its NAND logic operation; a NAND gate 212 for receiving signals from the inverters 204, 207, 208 and outputting signals generated according to its NAND logic operation; a NAND gate 213 for receiving signals from the inverters 205, 207, 208 and outputting signals generated according to its NAND logic operation; a NAND gate 214 for receiving signals from the inverters 204, 206, 209 and outputting signals generated according to its NAND logic operation; a NAND gate 215 for receiving signals from the inverters 205, 206, 209 and outputting signals generated according to its NAND logic operation; a NAND gate 216 for receiving signals from the inverters 204, 207, 209 and outputting signals generated according to its NAND logic operation; a NAND gate 217 for receiving signals from the inverters 205, 207, 209 and outputting signals generated according to its NAND logic operation; an inverter 201 for receiving the test mode signal TRATX from the test mode control unit 30 and outputting the inverted signal; an inverter 202 for receiving the inverted signal from the inverter 201 and outputting the twice-inverted signal; and an inverter 203 for receiving and inverting the twice-inverted signal from the inverter 202 and outputting the three-times inverted signal.

The conventional row redundancy predecoder unit 20 further includes: a NOR gate 218 for receiving output signals from the NAND gate 210 and from the inverter 203 and outputting signals generated according to its NOR logic operation; an inverter 219 for receiving and inverting an output signal from the NOR gate 218 and outputting the inverted signal TREB<7>; a NOR gate 220 for receiving output signals from the NAND gate 211 and the inverter 203 and outputting signals generated according to its NOR logic operation; an inverter 221 for receiving and inverting an output signal from the NOR gate 220 and outputting the inverted signal TREB<6>; a NOR gate 222 for receiving output signals from the NAND gate 212 and from the inverter 203 and outputting signals generated according to its NOR logic operation; an inverter 223 for receiving and inverting an output signal from the NOR gate 222 and outputting the inverted signal TREB<5>; a NOR gate 224 for receiving output signals from the NAND gate 213 and from the inverter 203 and outputting signals generated according to its NOR logic operation; an inverter 225 for receiving and inverting an output signal from the NOR gate 224 and outputting the inverted signal TREB<4>; a NOR gate 226 for receiving output signals from the NAND gate 214 and from the inverter 203 and outputting signals generated according to its NOR logic operation; an inverter 227 for receiving and inverting an output signal from the NOR gate 226 and outputting the inverted signal TREB<3>; a NOR gate 228 for receiving output signals from the NAND gate 215 and the inverter 203 and outputting signals generated according to its NOR logic operation; an inverter 229 for receiving and inverting an output signal from the NOR gate 228 and outputting the inverted signal TREB<2>; a NOR gate 230 for receiving output signals from the NAND gate 216 and from the inverter 203 and outputting signals generated according to its NOR logic operation; an inverter 231 for receiving and inverting an output signal from the NOR gate 230 and outputting the inverted signal TREB<1>; a NOR gate 232 for receiving output signals from the NAND gate 217 and from the inverter 203 and outputting signals generated according to its NOR logic operation; and an inverter 233 for receiving and inverting an output signal from the NOR gate 232 and outputting the inverted signal TREB<0>.

In the conventional row redundancy predecoder unit 20 having the above-mentioned structure, when the test mode signal TRATX generated at the test mode control unit 30 is active, one of output signals TREB<0:7> is selected at a low level by the row address data signals BXB<0:2> received from the row address buffer unit 14.

FIG. 4 is a circuit diagram of the conventional row redundancy enable signal generating unit 24 in FIG. 1. As shown in FIG. 4, the conventional row redundancy enable signal generating unit 24 includes: a NAND gate 241 for receiving the signal REB<7> from the row redundancy fuse unit 22 and the signal TREB<7> from the row redundancy predecoder unit 20; an inverter 242 for receiving and inverting an output signal from the NAND gate 241 and outputting the inverted signal; an inverter 243 for receiving and inverting an output signal from the inverter 242 and outputting an inverted signal RWL<7>; a NAND gate 244 for receiving the signal REB<6> from the row redundancy fuse unit 22 and the signal TREB<6> from the row redundancy predecoder unit 20; an inverter 245 for receiving and inverting an output signal from the NAND gate 244 and outputting the inverted signal; and an inverter 246 for receiving and inverting an output signal from the inverter 245 and outputting an inverted signal RWL<6>. In the same manner, the other signals TREB<5> . . . TREB<0> and the other signals REB<5> . . . REB<0> are processed by the corresponding NAND gate and two inventers to output signals RWL<5> . . . RWL<0>. For instance, a NAND gate 262 receives the signal REB<0> from the row redundancy fuse unit 22 and the signal TREB<0> from the row redundancy predecoder unit 20. An inverter 263 receives and inverts an output signal from the NAND gate 262 and outputs the inverted signal. Then an inverter 264 receives and inverts an output signal from the inverter 263 and outputs the inverted signal RWL<0>.

The signals REB<0:7> received from the row redundancy fuse unit 22 become 'low' when the row address signal applied externally is a row address signal necessary for redundancy and corresponds to data programming in the fuse. In a test mode, however, all of the signals REB<0:7> become 'high'.

FIG. 5 is a circuit diagram of a part of the conventional column address buffer unit 32 in FIG. 1 for particularly illustrating a column address buffer that receives a column address signal A<8> from the address buffer unit 10. Although not shown, the column address buffer unit 32 further includes multiple buffers each having the same structure as shown in FIG. 5 and receiving and processing other column address signals A<0:7>.

Referring to FIG. 5, the conventional column address buffer unit 32 comprises: a PMOS transistor P6 for transmitting a source voltage Vcc to a node Nd7 by a column address signal A<8> received from the address buffer unit 10; an inverter 321 for receiving and inverting a control signal YAEB and outputting the inverted signal; a PMOS transistor P7 for transmitting the source voltage Vcc to the node Nd7 by the signal received from the inverter 321; NMOS transistors N7, N8 connected between the node Nd7 and the ground voltage Vss in series and their operation being controlled by the output signal of the inverter 321 and the signal A<8> received from the address buffer unit 10; an inverter 322 for inverting a control signal YLB; a clock inverter 323 for transmitting the signal of the node Nd7 to a node Nd8 by a control signal YLB; an inverter 325 for receiving and inverting the signal of the node Nd8 and outputting the inverted signal to node Nd9; a clock inverter 326 for transmitting the signal of the node Nd9 to the node Nd8 by the control signal YLB; and an inverter 324 for receiving and inverting the signal of the node Nd8 and outputting the inverted signal BYB<8>.

The control signal YAEB is a signal for controlling receipt of the column address signal A<8> from the address buffer unit 10. The control signal YLB becomes 'low' in a column operation, thereby transmitting to the node Nd8 and latching the column address signal A<8> transmitted to the node Nd7.

FIG. 6 is a circuit diagram of the conventional column redundancy predecoder unit 38 in FIG. 1. As shown in FIG. 6, the column redundancy predecoder unit 38 comprises: an inverter 381 for receiving and inverting a signal BYB<0> from the column address buffer unit 32 and outputting the inverted signal; a NAND gate 383 for receiving signals from the inverter 381 and the test mode signal TRATY from the test mode control unit 30 and outputting signals generated according to its NAND logic operation; an inverter 384 for receiving and inverting an output signal from the NAND gate 383 and outputting the inverted signal; an inverter 385 for receiving and inverting a signal from the inverter 384 and outputting an inverted signal TYREB<0>; an inverter 382 for receiving and inverting an output signal from the inverter 381 and outputting the inverted signal; a NAND gate 386 for receiving an output signal from the inverter 382 and the test mode signal TRATY from the test mode control unit 30 and outputting signals generated according to its NAND logic operation; an inverter 387 for receiving and inverting an output signal from the NAND gate 386 and outputting the inverted signal; and an inverter 388 for receiving and inverting an output signal from the inverter 387 and outputting the inverted signal TYREB<1>. When the test mode signal TRATY from the test mode control unit 30 is active, one of the outputted signals TYREB<0:1> becomes 'low' according to the signal BYB<0> received from the column address buffer unit 32.

FIG. 7 is a circuit diagram of the conventional column redundancy enable signal generating unit 42 in FIG. 1. As shown in FIG. 7, the column redundancy enable signal generation unit 42 comprises: a NAND gate 421 for receiving the signal YREB<0> from the column redundancy fuse unit 40 and the signal TYREB<0> from the column redundancy predecoder unit 38; an inverter 422 for receiving and inverting an output signal from the NAND gate 421 and outputting the inverted signal; an inverter 423 for receiving and inverting an output signal from the inverter 422 and outputting the inverted signal RYS<0>; a NAND gate 424 for receiving the signal YREB<1> from the column redundancy fuse unit 40 and the signal TYREB<1> from the column redundancy predecoder unit 38; an inverter 425 for receiving and inverting an output signal from the NAND gate 424 and outputting the inverted signal; and an inverter 426 for receiving and inverting an output signal from the inverter 425 and outputting the inverted signal RYS<1>.

The signals YREB<0:1> received from the column redundancy fuse unit 40 become 'low' by data programming in fuse. Here, the signals YREB<0:1> become 'low' when the column address signal applied externally is a column address signal necessary for redundancy and corresponds to data programming in the fuse. In a test mode, however, all of the signals YREB<0:1> become 'high'.

The operation of the conventional semiconductor memory device having the above-mentioned structure will be described in more detail as follows.

In order to use redundancy memory cells provided in a redundancy region of the memory device, it is first required to detect deterioration of redundancy memory cells. If there is no deterioration or damage to the redundancy memory cells, the redundancy memory cells will replace defective memory cells. The test operation to detect any deterioration in the redundancy memory cells starts when a test mode signal TRATX becomes active and involves detection of any deterioration of word lines in the redundancy memory cell array unit 52.

The test mode signal TRATX is generated by a combination of the address signals A<0:8> received from the address buffer unit 10 and the signal received from the command control unit 28 in the test mode control unit 30, and is applied to the row redundancy predecoder unit 20.

The row redundancy predecoder unit 20 outputs one of 8 output signals TREB<0:7> as a 'low' level signal based on the test mode signal TRATX received from the test mode control unit 30 and the row address data signals BXB<0:2> received from the row address buffer unit 14. Here, the operation that a 'low' signal is generated from the row redundancy predecoder unit 20 corresponds to the operation that redundancy cells are selected instead of the defective cells in a normal operation mode. And, the defects of word lines are detected by accessing the redundancy cell array. In a normal operation, a signal for selecting redundancy memory cells by fuse data is one of signals REB<0:7> outputted from the row redundancy fuse unit 22 that becomes 'low'.

The test operation to detect a deterioration of bit lines of the redundancy cell array unit 52 is performed by applying the test mode signal TRATY to the column redundancy predecoder unit 38.

FIG. 8 is an operation timing for detecting deterioration of redundancy memory cells by using the conventional semiconductor memory device having the redundancy circuit as discussed above. In FIG. 8, t0 represents a time when a normal operation is performed, t1 represents a time for precharging all memory cells, t2 represents a time for entering into the test mode by application of particular commands and addresses, t3 represents a time for activating the test mode signal TRATX or TRATY for redundancy memory cell test, t4 represents a time for testing deterioration of redundancy memory cells, t5 represents a time for exiting the test mode, t6 represents a time for precharging all memory cells, t7 represents a time for applying a particular command for a normal operation, and t8 represents a time for performing a normal operation instead of the test mode operation.

However, the conventional semiconductor memory device having the redundancy circuit has at least several drawbacks. First, a word line disturb test mode is a mode for testing the interference effect of all word line operations by fixing all bit lines (bit line addresses) and is essential to detecting deterioration of memory cells. The necessary time for the word line disturb test mode will be represented in EQUATION 1.

$$tWRITE+tDISTURB+tSCAN+tREAD=(tcycle \times Nred\_memory)+(trefresh \times Nword)+(tcycle \times Nword2)+(tcycle \times Nred\_memory) \quad \text{[EQUATION 1]}$$

In EQUATION 1 above, "tWRITE" is a time necessary for a write operation, and "tcycle" is a time necessary for turning off the word lines, after driving the word lines of memory cells and performing one read or write operation. "tcycle" is also referred to hereinafter as "word line move time". Generally, the word line move time is 100 ns. "Nred_memory" is the number of redundancy memory cells and "tDISTURB" is a time necessary for being influenced by all the word lines "Nword" including tested word lines of the memory cells, corresponding to continuous on/off time during a refresh time "trefresh" (generally 64 msec) to all word lines. "tSACN" is an operation signal for refreshing all the word lines in order to maintain data of the memory cells connected to unselected word lines. The refresh operation is expressed by "Nword2". The "tREAD" is a time necessary for performing a read operation.

The test time T of normal memory cell regions is represented in EQUATION 2. In this equation, "Nmemory" indicates the entire normal memory cell area.

$$T=(tcycle \times Nmemory)+(trefresh \times Nword)+(tcycle \times Nword2)+(tcycle \times Nmemory) \quad \text{[EQUATION 2]}$$

As an example, when a redundancy memory cell having 8 word lines and 2 column lines is connected to a normal memory cell of 64M bit having 8192 word lines, and 4 bit lines are connected to 1 column line comprising 16 I/O lines, Nred_memory is 1024 bit. Here, the Nred_memory having 1024 bit needs the test time of approximately 531 sec. according to EQUATION 1 above. The time for testing normal memory cells is also determined to be 537.7 sec. and EQUATIONs 1 and 2 have an approximate value by a multiplication 'trefresh×Nword'. This is because word lines having redundancy memory cells connected thereto correspond to the number of word lines of normal memory cells and therefore, a disturb operation time is necessary for all word lines. That is, there is a problem in that the test time for redundancy memory cells is similar to that for normal memory cells although the number of redundancy memory cells is smaller than the number of normal memory cells.

Second, there is still a problem in that there remains deterioration that is not detected by testing of the redundancy memory cells. That is, in the conventional test mode for detecting redundancy memory cells, redundancy memory cell blocks are detected by performing a test mode after detecting the normal memory cells and therefore, any deterioration generated at the interface of redundancy memory cells adjacent to the normal memory cells is not tested due to the time lapse of several msec. Therefore, certain defective memory cells are substituted with those redundancy memory cells having deteriorations. This causes a problem of recovery failures and deterioration in device performance.

SUMMARY OF THE INVENTION

Accordingly, the present invention has been made to solve the above-mentioned problems and other problems associated with conventional art.

An object of the invention is to provide a redundancy method for semiconductor memory device, capable of detecting deterioration by interference of memory cells adjacent to a normal memory cell with a redundancy memory cell while reducing the detection time.

Another object of the present invention is to provide a semiconductor memory device having a redundancy circuit capable of realizing a redundancy method of the present invention.

In order to achieve the above and other objects, a semiconductor memory device according to an embodiment of the present invention comprises a normal memory cell array unit, a redundancy memory cell array unit for recovering defective cells of the normal memory cell array unit, and a memory driving unit for operating the redundancy memory cell array unit and the adjacent normal memory cell immediately after a word line move time 'tcycle' in the normal memory cell array unit by using address data.

The memory driving unit according to an embodiment of the present invention comprises: a test mode signal generating unit for generating a test mode signal to indicate a test operation; a row address counter unit for receiving the test mode signal, a first signal enabled in a refresh mode and a second signal toggling in the refresh mode and for generating a row address counter signal; a row counter reset unit for receiving the test mode signal, the second signal and a part of the row address counter signal and for generating a reset signal to reset the row address counter unit; a row counter reset initializing unit for receiving the test mode signal and for generating an initialization signal to initialize the row counter reset unit; a row address buffer unit for receiving the row address counter signal and a row address signal from an external source and for generating a row address data signal; a row predecoder and a decoder unit for receiving the row address data signal and for generating a signal to select word lines of the normal memory cell array unit; a row redundancy address buffer unit for receiving the highest row address signal received from an outside source, the test mode signal and the row address counter signal and for generating a row redundancy address signal; a row redundancy predecoder and decoder unit for receiving the row address data signal, the test mode signal and the row redundancy address signal and for generating a signal to select word lines of the redundancy memory cell array unit; a column address buffer unit for receiving a column address signal from an external source and for generating a column address data signal; a column predecoder and decoder unit for receiving the column address data signal and for generating a signal to select word lines of the normal memory cell array unit; a column redundancy address buffer unit for receiving the highest column address signal received from an external source and the test mode signal and for generating a column redundancy address signal; and a column redundancy predecoder and decoder unit for receiving the column address data signal, the test mode signal and the column redundancy address signal and for generating a signal to select redundancy word lines of the redundancy memory cell array unit.

A semiconductor memory device according to another embodiment of the present invention comprises: a normal memory cell array unit comprising N memory banks for storing a plurality of data; a redundancy memory cell array unit comprising N memory banks for recovering defective cells of the normal memory cell array unit; a test mode signal generating unit for generating a test mode signal to indicate a test operation; a row address counter unit for receiving the test mode signal, a first signal enabled in a refresh mode and a second signal toggling in the refresh mode and for generating a row address counter signal; a row counter reset unit for receiving the test mode signal, the second signal and a part of the row address counter signal and for generating a reset signal to reset the row address counter unit; a row counter reset initializing unit for receiving the test mode signal and for generating an initialization signal to initialize the row counter reset unit; a row address buffer unit for receiving the row address counter signal and a row address signal from an outside source and for generating a row address data signal; N row predecoder and decoder units for receiving the row address data signal and for generating a signal to select word lines of the normal memory cell array unit; a row redundancy address buffer unit for receiving the highest row address signal, the test mode signal and the row address counter signal and for generating a row redundancy address signal; N row redundancy predecoder and decoder units for receiving the row address data signal, the test mode signal and the row redundancy address signal and for generating a signal to select redundancy word lines of the redundancy memory cell array unit; a column address buffer unit for receiving a column address signal from an external source and for generating a column address data signal; N column predecoder and decoder units for receiving the column address data signal and for generating a signal to select word lines of the normal memory cell array unit; a column redundancy address buffer unit for receiving the highest column address signal received from an external source and the test mode signal and for generating a column redundancy address signal; N column redundancy predecoder and decoder units for receiving the column address data signal, the test mode signal and the column redundancy address signal and for generating a signal to select redundancy word lines of the redundancy memory cell array unit; a band address buffer unit for receiving an address signal having address data of a memory bank; and a bank control units for selectively controlling operations of the N row predecoder and decoder unit, the N row redundancy predecoder and decoder units, the N column predecoder and decoder units, and the N column redundancy predecoder and decoder units by decoding address signals received from the bank address buffer unit in the test mode.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

Figure 1:
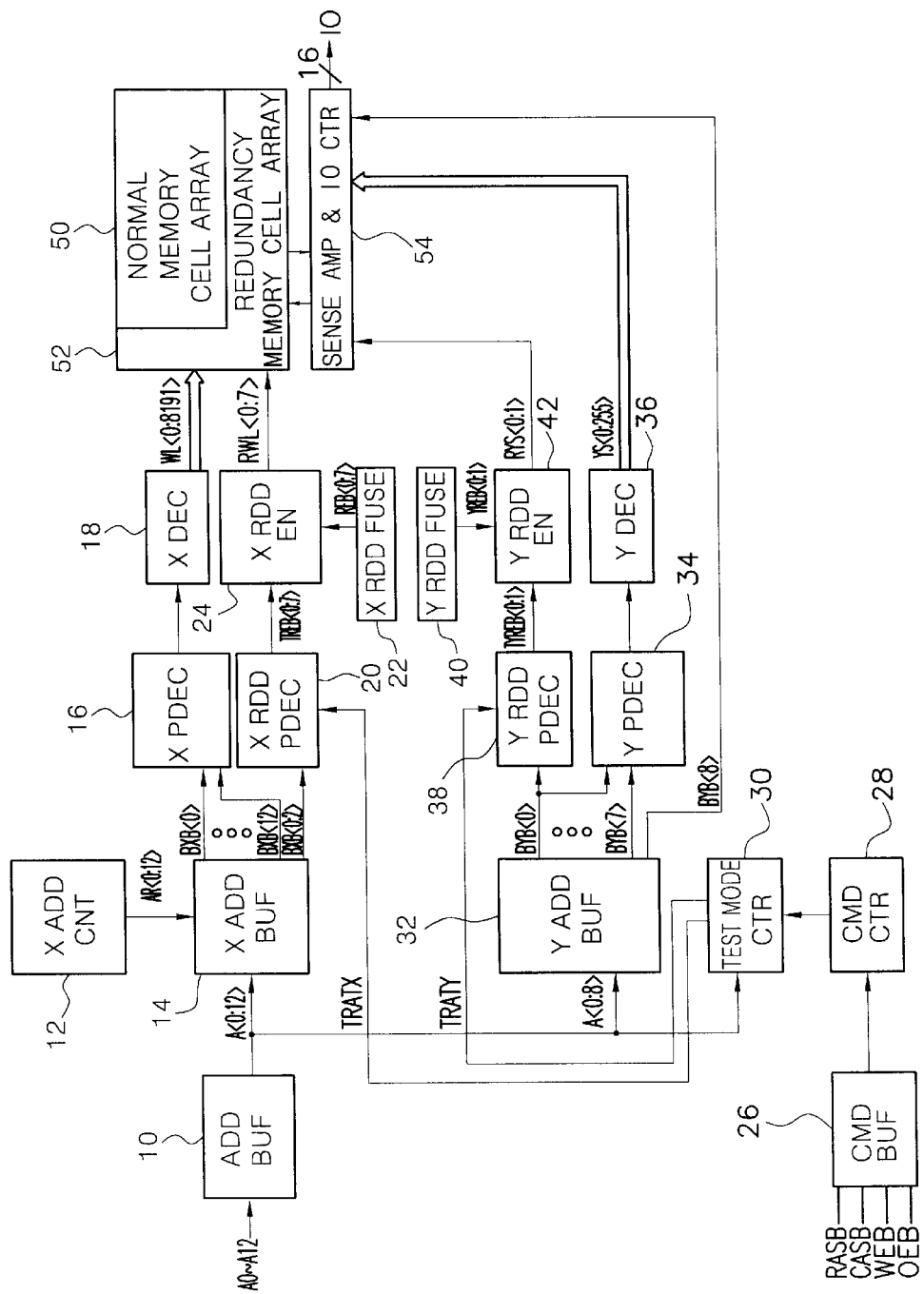
FIG. 1 is a block diagram for showing a semiconductor memory device having a conventional redundancy circuit.
Figure 2:
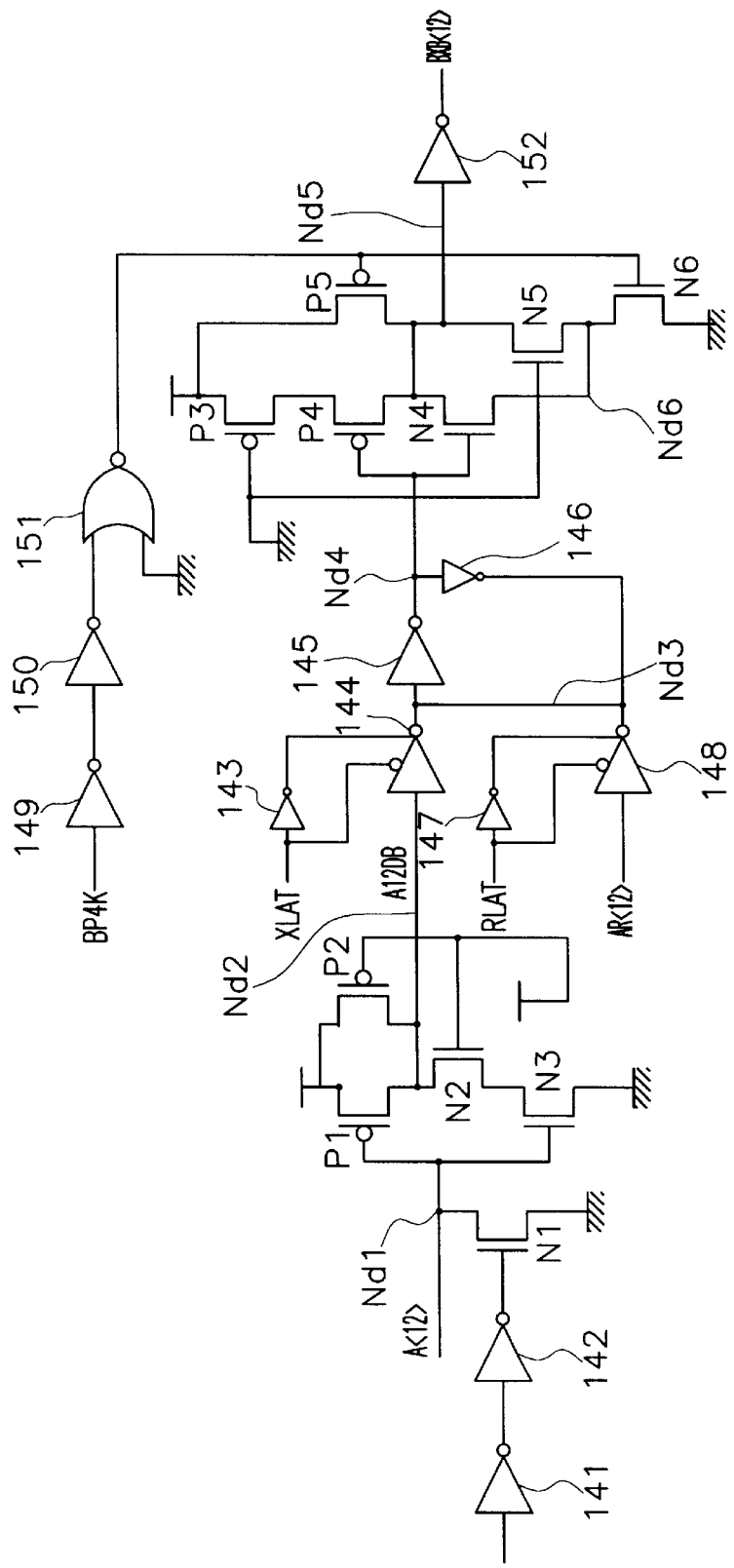
FIG. 2 is a circuit diagram of a conventional row address buffer unit receiving the highest row address signal illustrated in FIG. 1.
Figure 3:
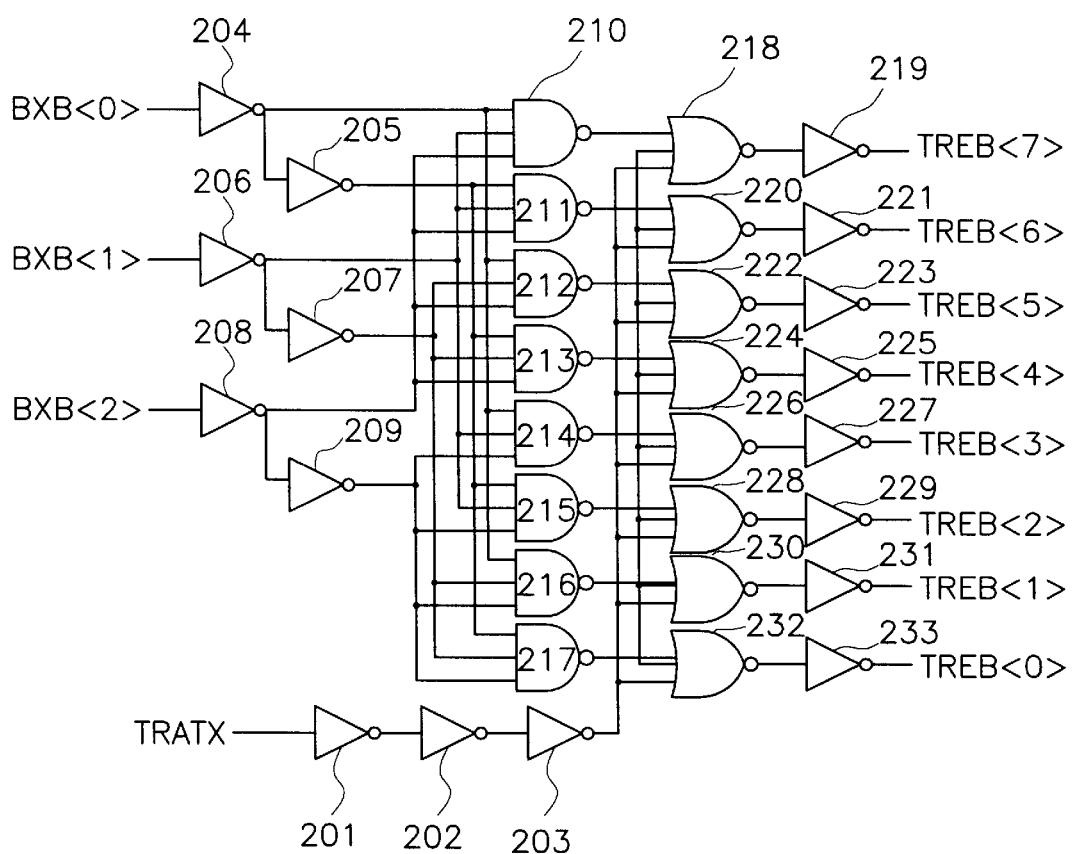
FIG. 3 is a circuit diagram of a conventional row redundancy predecoder unit illustrated in FIG. 1.
Figure 4:
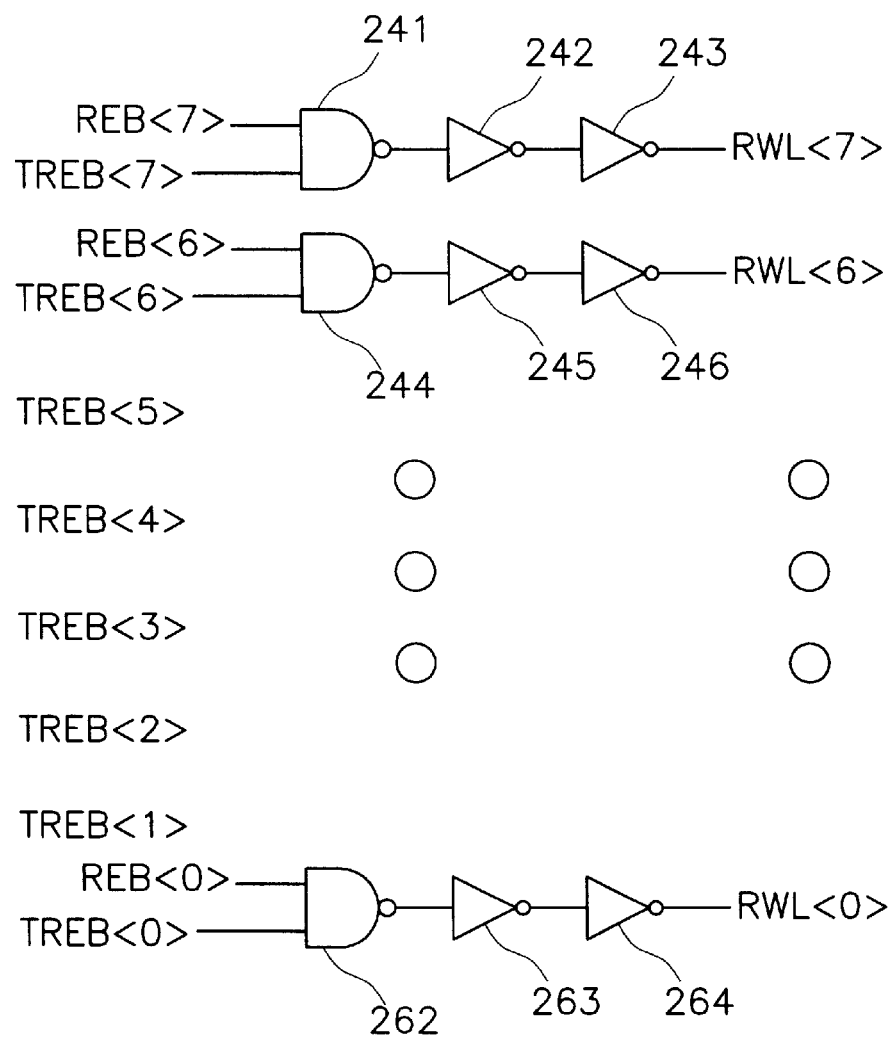
FIG. 4 is a circuit diagram of a conventional row redundancy enable signal generating unit illustrated in FIG. 1.
Figure 5:
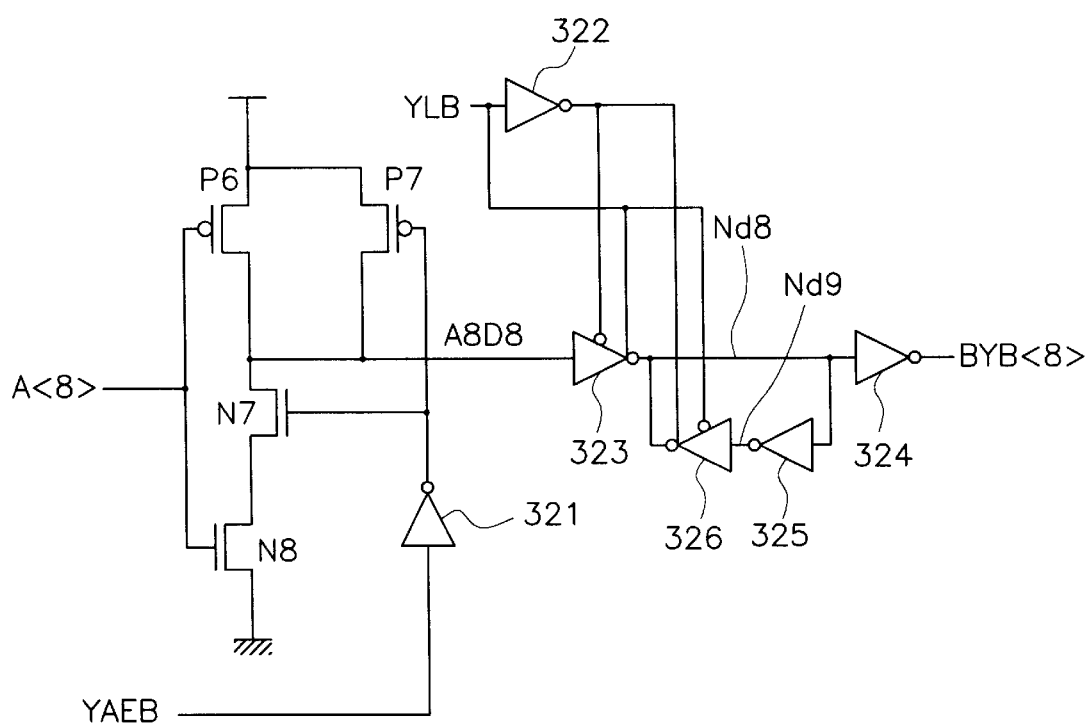
FIG. 5 is a circuit diagram of a conventional column address buffer unit illustrated in FIG. 1.
Figure 6:
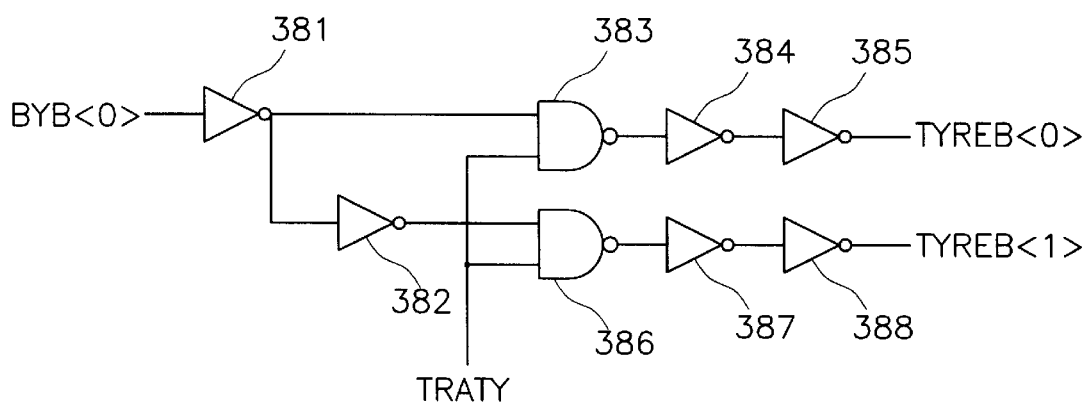
FIG. 6 is a circuit diagram of a conventional column redundancy predecoder unit illustrated in FIG. 1.
Figure 7:
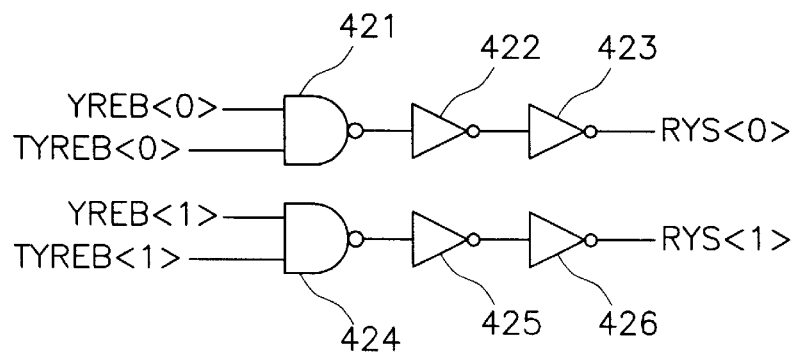
FIG. 7 is a circuit diagram of a conventional column redundancy enable signal generating unit illustrated in FIG. 1.
Figure 8:
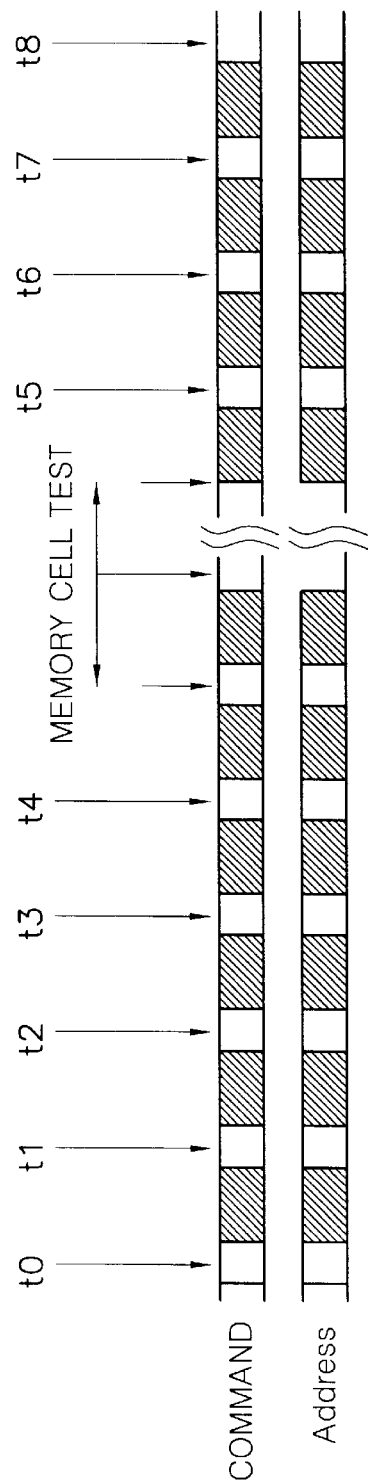
FIG. 8 is an operation timing for detecting defects of redundancy memory cells in a semiconductor memory device having a conventional redundancy circuit.

The embodiments of the present invention will be described in detail with reference to accompanying drawings. In the drawings, a part having the same function will be represented by the same reference numerals and there will be no repeated description of the same parts. In addition, all the elements shown in the drawings in connection with the present invention are operatively coupled.

Figure 9:
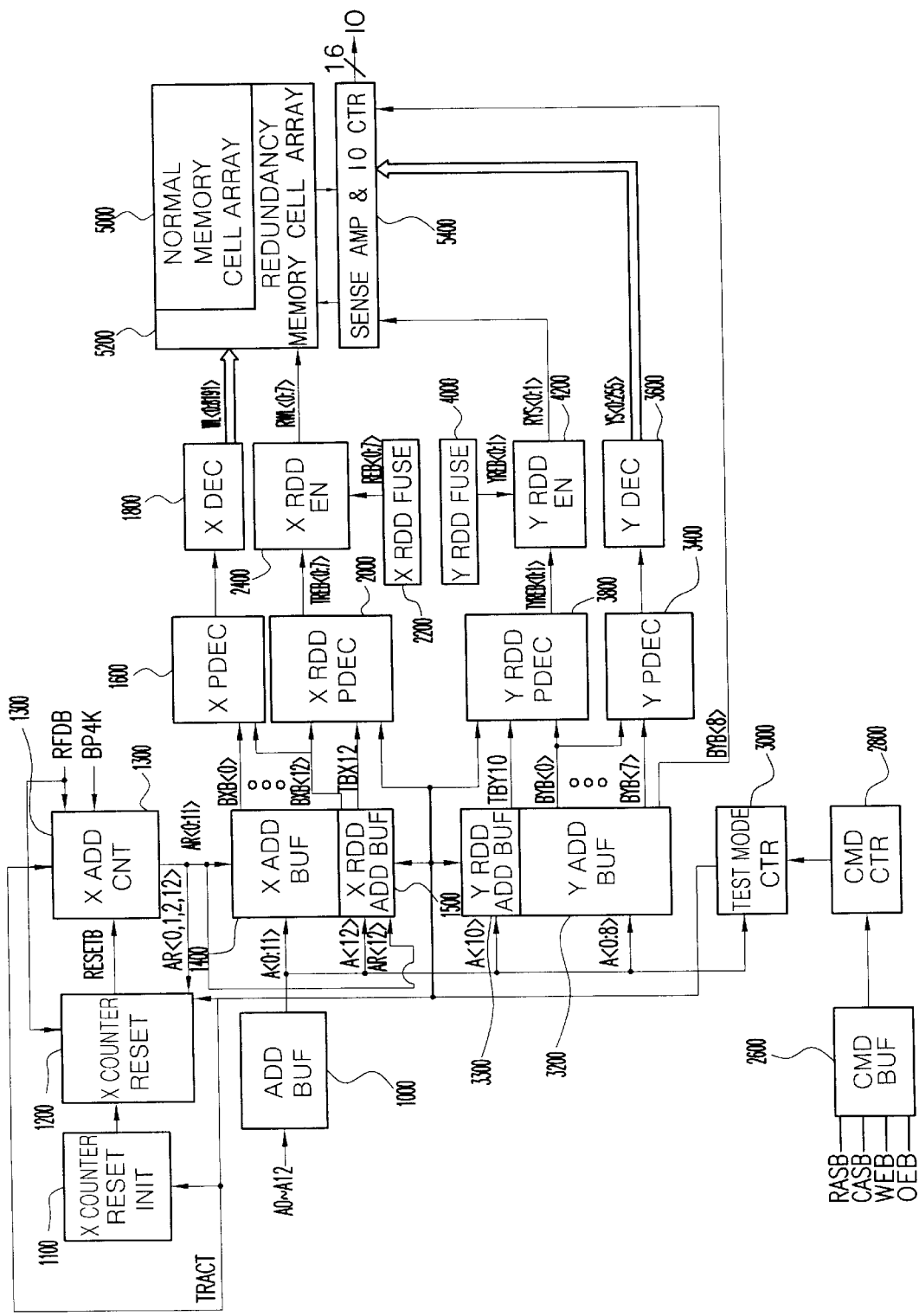
FIG. 9 is a block diagram of a semiconductor memory device having a redundancy circuit according to a first embodiment of the present invention.

FIG. 9 is a block diagram of a semiconductor memory device having a redundancy circuit according to a first embodiment of the present invention. In this example, the memory device is a memory having 64M bit.

Referring to FIG. 9, the semiconductor memory device having the redundancy circuit of the present invention comprises: a normal memory cell array unit 5000 of 64M bit for storing a plurality of data and information; a redundancy memory cell array unit 5200 of 1K bit for recovering defective cells in the normal memory cell array unit 5000; and a sense amplification unit and I/O control unit 5400 for sensing and amplifying read data received from the normal memory cell array unit 5000 or the redundancy memory cell array unit 5200 and outputting the data to an I/O line or for sensing and amplifying write data received through the I/O line and outputting the data to the memory cell array unit 5000 or to the redundancy memory cell array unit 5200.

The semiconductor memory device further comprises: an address buffer unit 1000 for receiving address signals A0~A12 from an external source; a command buffer unit 2600 for receiving command signals i.e., row address strobe bar signal RASB, column address strobe signal CASB, write enable bar signal WEB, output enable bar signal OEB from an external source; a command control unit 2800 for receiving output signals from the command buffer unit 2600; and a test mode control unit 3000 for receiving signals from the command control unit 2800 and the address signals A<0:12> from the address buffer unit 1000 and for generating a test mode signal TRACT to detect deterioration of word lines and bit lines in the redundancy memory cell array unit 5200.

The semiconductor memory device further comprises: a row address counter unit 1300 for receiving the test mode signal TRACT from the test mode control unit 3000, a delayed refresh enable bar signal RFDB motivated by the RASB command and toggling once from a 'high' to a 'low' level in the refresh operation to one word line, and a bonding pad 4K refresh enable signal BP4K generated at a command decoder (not shown) in the refresh operation and for generating row address counter signals AR<0:12>; a row counter reset unit 1200 for receiving the refresh delay bar signal RFDB and the TRACT signal from the test mode control unit 3000 and row address counter signals AR<0,1,2,12> from the row address counter unit 1300 and for generating a reset signal RESETB to the row address counter unit 1300; and a row counter reset initializing unit 1100 for receiving the test mode signal TRACT from the test mode control unit 3000 and for generating an initialization signal TRACTDB to the row counter reset unit 1200.

The semiconductor memory device further comprises: a row address buffer unit 1400 for receiving address signals A<0:12> from the address buffer unit 1000 and row address counter signals AR<0:11> from the row address counter unit 1300 and for generating row address data signals BXB<0:12>; a row predecoder unit 1600 for receiving the row address data signals BXBK<0:12> from the row address buffer unit 1400 and for generating decoded signals; and a row decoder unit 1800 for decoding signals received from the row predecoder unit 1600 and for generating signals WL<0:8191> to select word lines of the normal memory cell array unit 5000.

The semiconductor memory device further comprises: a row redundancy address buffer unit 1500 for receiving the highest row address signal A<12> from the address buffer unit 1000, the test mode signal TRACT from the test mode control unit 3000 and the row address counter signal AR<12> from the row address counter unit 1300 and for generating a row redundancy address signal TBX12; a row redundancy predecoder unit 2000 for receiving the row address data signals BXB<0:12> from the row address buffer unit 1400, the test mode signal TRACT from the test mode control unit 3000 and the row redundancy address signal TBX12 from the row redundancy address buffer unit 1500 and for generating decoded signals TREB<0:7>; a row redundancy fuse unit 2200 for generating programming row redundancy data signals REB<0:7>; and a row redundancy enable signal generating unit 2400 for receiving the decoded signals TREB<0:7> from the row redundancy predecoder unit 2000 and the programming row redundancy data signals REB<0:7> from the row redundancy fuse unit 2200 and for generating signals RWL<0:7> to select word lines of the redundancy memory cell array unit 5200.

The semiconductor memory device further comprises: a column address buffer unit 3200 for receiving address signals A<0:8> from the address buffer unit 1000 and for generating column address data signals BYB<0:8>; a column predecoder unit 3400 for receiving the column address data signals BYB<0:7> from the column address buffer unit 3200 and for generating a decoded signal; and a column decoder unit 3600 for receiving the decoded signal from the column predecoder unit 3400 and for generating and outputting signals YS<0:255> used to select bit lines of the normal memory cell array unit 5000 to the amplification and I/O control unit 54.

The semiconductor memory device further comprises: a column redundancy address buffer unit 3300 for receiving the row address signal A<10> from the address buffer unit 1000 and the test mode signal TRACT from the test mode control unit 3000 and for generating a column redundancy address signal TBY10; a predecoder unit 3800 for receiving column address data signals BYB<0:7> from the column address buffer unit 3200, the test mode signal TRACT from the test mode control unit 3000 and the column redundancy address signal TBY10 from the column redundancy address buffer unit 3300 and for generating decoded signals TYREB<0:1>; a fuse unit 4000 for generating programming column redundancy data signal YREB<0:1>; and a column redundancy enable signal generating unit 4200 for receiving the decoded signals TYREB<0:1> from the column redundancy predecoder unit 3800 and the programming column redundancy data signals YREB<0:1> from the column redundancy fuse unit 4000 and for generating and outputting signals RYS<0:1> used to select bit lines of the redundancy memory cell array unit 5200 to the sense amplification and I/O control unit(s) 5400.

Figure 10:
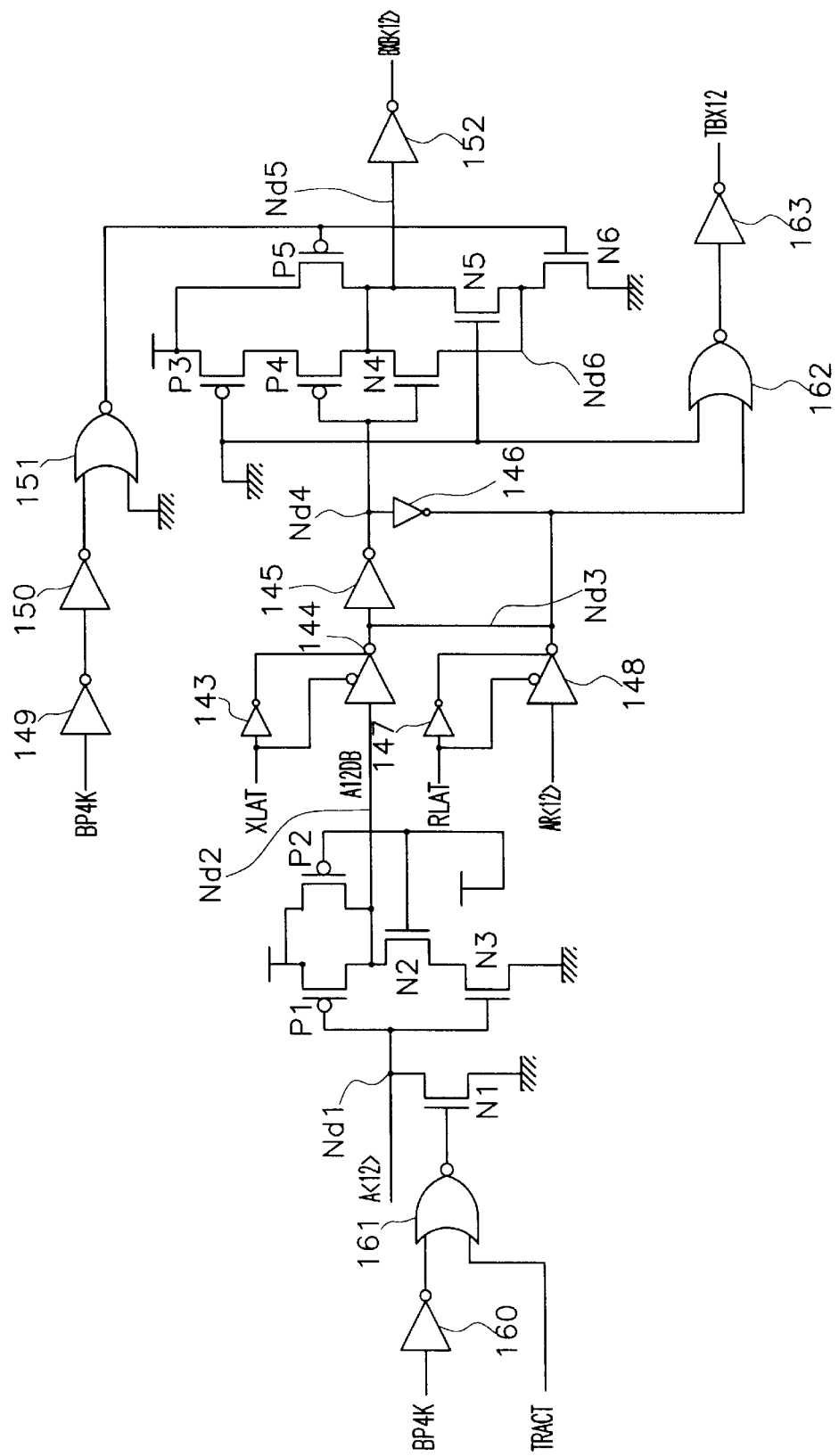
FIG. 10 is a circuit diagram of a row redundancy address buffer unit for receiving the row redundancy highest address signal in the device of FIG. 9 according to an embodiment of the present invention.

FIG. 10 is a circuit diagram of the row redundancy address buffer unit 1500 in FIG. 9. As shown, the row redundancy address buffer unit 1500 comprises: an inverter 160 for receiving a BP4K signal outputted from a command decoder (not shown) in a refresh operation; a NOR gate 161 for receiving an output signal from the inverter 160 and the test mode signal TRACT from the test mode control unit 3300 and for generating a signal according to its NOR logic operation; an NMOS transistor N1 for discharging the electric potential of the node Nd1 that receives the highest row address signal A<12> from the address buffer unit 1000 by the operation of the output signal from the NOR gate 161, to a ground voltage Vss; a PMOS transistor P1 for transmitting a source voltage Vcc to the node Nd2 when the signal of the node Nd1 is 'low'; a PMOS transistor P2 connected to the PMOS transistor P1 in a row, for receiving the source voltage Vcc at its gate; and NMOS transistors N2, N3 connected between the node Nd2 and the ground voltage Vss, and their operation being controlled by the source voltage Vcc and the signal of node Nd1.

The semiconductor memory device further comprises: a clock inverter 144 for receiving a signal of the node Nd2 under control of a control signal XLAT activated as 'high' in operation except for a refresh and for outputting the inverted signal to a node Nd3; an inverter 145 for receiving and inverting a signal of the node Nd3 and for outputting the inverted signal to a node Nd4; an inverter 146 for receiving and inverting a signal of the node Nd4 and for outputting the inverted signal to the node Nd3; a clock inverter 148 for outputting the highest row address signal AR<12> received from the row address counter unit 1300 to the node Nd3 by a control signal RLAT activated as 'high' in the refresh operation; a NOR gate 162 for receiving a signal of the node Nd3 and the ground voltage Vss and for outputting a signal generated according to its NOR logic operation; an inverter 163 for receiving and inverting an output signal from the NOR gate 162 and for outputting an inverted signal TBX12; PMOS transistors P3, P4 connected between the source voltage Vcc and a node Nd5 in series, and their operation being controlled by the ground voltage Vss and the signal of node Nd4; and a NMOS transistor N4 connected between the node Nd5 and the node Nd6 and its operation being controlled by the signal of the node Nd4.

The semiconductor memory device further comprises: an inverter 149 for receiving and inverting the signal BP4K outputted from a command decoder (not shown) in the refresh operation and for outputting the inverted signal; an inverter 150 for inverting and outputting a signal received from the inverter 149; a NOR gate 151 for receiving a signal output from the inverter 150 and the ground voltage Vss and for outputting a signal generated according to its NOR logic operation; a PMOS transistor P5 connected between the source voltage Vcc and the node Nd5 an receiving an output signal of the NOR gate 151 at its gate; NMOS transistors N5, N6 connected between the node Nd5 and the ground voltage Vss in series, their operation being controlled by the ground voltage Vss and the output signal of the NOR gate 151; and an inverter 152 for inverting a signal received from the node Nd5 and thereby outputting to the row address data signal BXB<12>.

First, read/write operations in a normal operation will be described. In this section, BP4K generated from the command decoder in a refresh operation is 'low' and TRACT generated from the test mode control unit 3000 is 'low'. And, the control signal RLAT is 'high' and the control signal XLAT is 'low'. Therefore, the row redundancy address buffer unit 1500 performs 8K refresh operation and the highest row address signal A<12> from the address buffer unit 1000 is transmitted to the node Nd2. The highest row address signal A<12> transmitted to the node Nd12 is transmitted through the clock inverter 144 controlled by the control signal XLAT and then, decoded by the inner decoder circuit in the next terminal to finally generate a row address data signal BXB<12>. Here, the row address data signal BXB<12> is changed according to the state of the highest row address signal A<12>. The row redundancy address signal TBX12 is also changed according to the highest row address signal A<12>, however, it is not affected by the highest row address signal A<12> in the subsequently following operation since the test mode signal TRACT is 'low'. Therefore, the row redundancy address buffer unit 1500 is not affected by the highest row address signal A<12> in the subsequently following operation since the test mode signal TRACT is 'low' in a normal operation, not in a test mode.

Next, read/write operations in a test mode will be described. In a test mode, the BP4K is 'high' since the 8K refresh operation is converted into a 4K refresh operation and performed and the test mode signal TRACT is 'high'. The control signal RLAT is 'high' and the control signal XLAT is 'low'. The highest row address data signal BXB<12> generated at the row redundancy address buffer unit 1500 is continuously maintained at 'low' level and therefore, the highest row address data signal BXB<12> significant in the 8K refresh operation is operated. And, the row redundancy address signal TBX12 is generated by the highest row address signal A<12> generated at the row address buffer unit 1000. Here, when the row redundancy address signal TBX12 is 'low', the normal memory cell array unit 5000 is selected and when it is 'high', the redundancy memory cell array unit 5200 is selected.

Next, a refresh operation will be described when the device is not in a test mode. In this section, BP4K generated from the command decoder unit in a refresh operation is 'low' and TRACT generated from the test mode control unit 3000 is 'low'. And, the control signal RLAT is 'high' and the control signal XLAT is 'low'. Therefore, the row redundancy address buffer unit 1500 performs a 8K refresh operation and generates a row address data signal BXB<12> by the highest row address counter signal AR<12> generated at the row address counter unit 1300. Here, the row address data signal BXB<12> is changed according to the highest row address counter signal AR<12>. And, the row redundancy address signal TBX12 is also changed according to the highest row address counter signal AR<12>, however, is not affected by the highest row address counter signal AR<12> in the subsequently following operation since the test mode signal TRACT is 'low'.

Next, a refresh operation in a test mode will be described. In a test mode, a 8K refresh operation is converted into a 4K refresh operation and is performed similar to read/write operations in the test mode. Therefore, the BP4K is 'high' and the test mode signal TRACT is 'high' in a test mode. And, the control signal RLAT is 'high' and the control signal XLAT is 'low'. The highest row address data signal BXB<12> generated at the row redundancy address buffer unit 1500 is continuously maintained at 'low' level and therefore, the highest row address data signal BXB<12> significant in the 8K refresh operation is operated. And, a row redundancy address signal TBX12 is generated by the highest row address counter signal AR<12> generated at the row address counter unit 1300. Here, when the row redundancy address signal TBX12 is 'low', the normal memory cell array unit 5000 is selected and when it is 'high', the redundancy memory cell array unit 5200 is selected.

Figure 11:
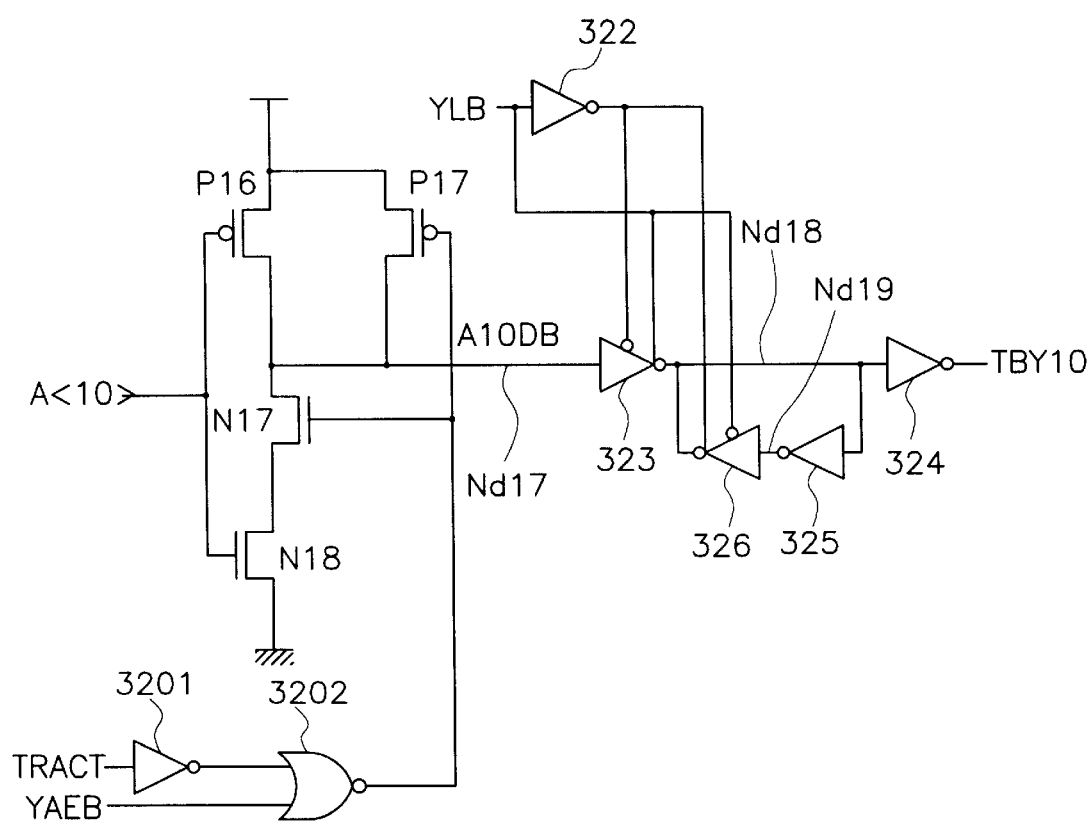
FIG. 11 is a circuit diagram of a column redundancy address buffer unit of the device illustrated in FIG. 9 according to an embodiment of the present invention.

FIG. 11 is a circuit diagram of the column redundancy address buffer unit 3300 of the present invention illustrated in FIG. 9, which comprises: a PMOS transistor P16 for transmitting a source voltage Vcc to a node Nd17 by a column address signal A<10> received from the address buffer unit 1000; an inverter 3201 for receiving and inverting the test mode signal TRACT from the test mode control unit 3000 and for outputting the inverted signal; a NOR gate 3202 for receiving a signal from the inverter 3201 and control signal YAEB and for outputting a signal generated according to the NOR logic operation; a PMOS transistor P17 for transmitting the source voltage Vcc to the node Nd17 by a signal received from the NOR gate 3202; NMOS transistors N17, N18 connected between the node Nd17 and ground voltage Vss in series, the operation being controlled by an output signal of the NOR gate 3202 and the signal A<10> received from the address buffer unit 1000; a clock inverter 323 for transmitting the node signal Nd17 to a node Nd18 under control of a control signal YLB; an inverter 325 for receiving the signal of the node Nd18 and for outputting the inverted signal to a node Nd19; a clock inverter 326 for transmitting the signal of the node Nd19 to the node Nd18 under control of the control signal YLB; and an inverter 324 for receiving and inverting the signal of the node Nd18 and for outputting the inverted signal TBY<10>. The control signal YAEB is a signal controlling to receive a column address signal A<10> from the address buffer unit 1000 and the control signal YLB becomes 'low' in column operation to transmit and latch the column address signal A<10> transmitted to the node Nd17 to the node Nd18.

First, read/write operations in a normal operation will be described. The row address signal is applied by the RASB and after a predetermined time, the control signal YAEB becomes 'low' under control of the column address strobe signal CASB and then the control signal YLB becomes 'low'. At this time, the highest column address signal A<10> received from the address buffer unit 1000 is blocked and not transmitted to the inside since the test mode signal TRACT is 'low'. Therefore, at this point, the column redundancy address buffer unit 3300 does not generate a column redundancy address signal TBY10.

Next, a column redundancy address signal TBY10 is generated based on the highest column address signal A<10> received from the address buffer unit 1000 since the test mode signal TRACT is 'high' in the read/write operation of the test mode. Here, when the column redundancy address signal TBY10 is 'low', the normal memory cell array unit 5000 is selected and when it is 'high', the redundancy memory cell array unit 5200 is selected.

Next, the test mode signal TRACT turns 'low' in a refresh operation when the device is not in a test mode. Therefore, the highest column address signal A<10> received from the address buffer unit 1000 is blocked and not transmitted to the inside. As a result, the column redundancy address buffer unit 3300 does not generate the column redundancy address signal TBY10 at this time.

Next, in a test mode, the test mode signal TRACT is 'high' in a refresh operation and therefore, a column redundancy address signal TBY10 is generated by the highest column address signal A<10> received from the address buffer unit 1000. When the column redundancy address signal TBY10 is 'low', the normal memory cell array unit 5000 is selected and when it is 'high', the redundancy memory cell array unit 5200 is selected.

Figure 12:
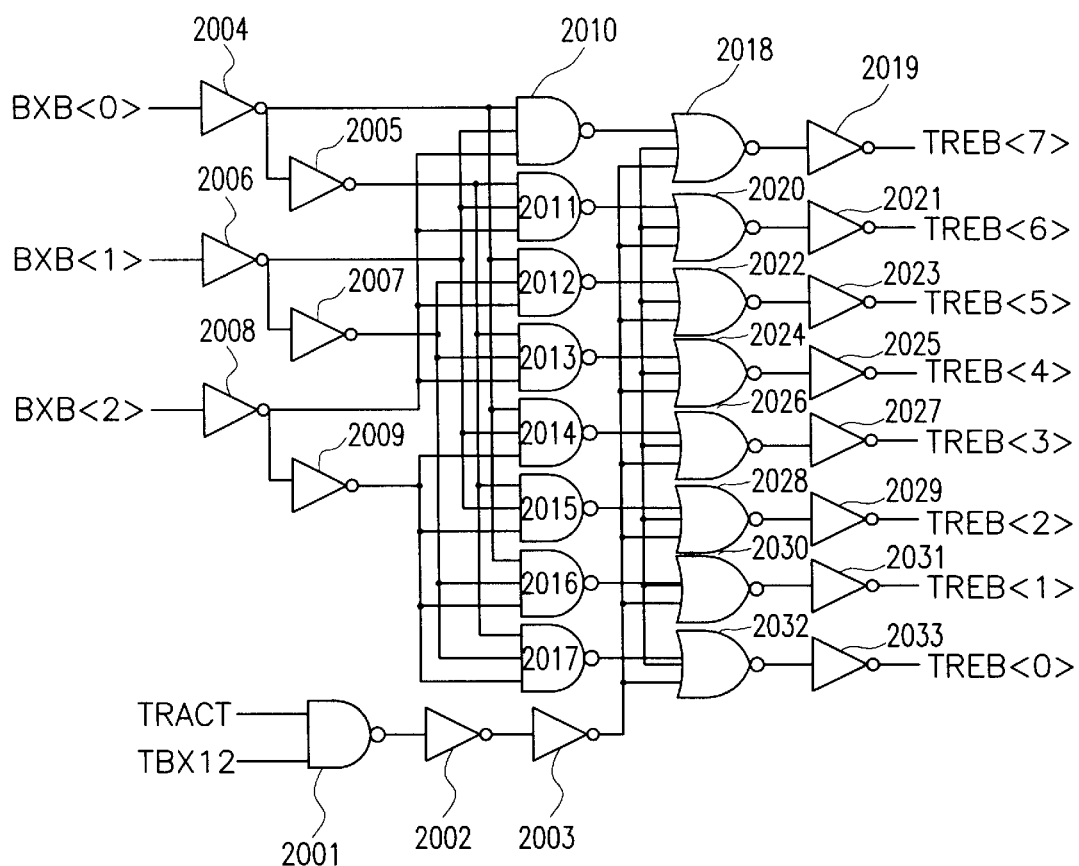
FIG. 12 is a circuit diagram of a row redundancy predecoder unit of the device illustrated in FIG. 9 according to an embodiment of the present invention.

FIG. 12 is a circuit diagram of the row redundancy predecoder unit 2000 of the present invention illustrated in FIG. 9. The row redundancy predecoder unit 2000 comprises: an inverter 2004 for receiving and inverting a row address data signal BXB<0> received from the row address buffer unit 1400 and for outputting the inverted signal; an inverter 2005 for inverting a signal output from the inverter 2004 and outputting the inverted signal; an inverter 2006 for receiving and inverting a row address data signal BXB<1> received from the row address buffer unit 1400 and for outputting the inverted signal; an inverter 2007 for inverting a signal output from the inverter 2006 and outputting the inverted signal; an inverter 2008 for receiving and inverting a row address data signal BXB<2> received from the row address buffer unit 1400 and for outputting the inverted signal; an inverter 2009 for inverting a signal output from the inverter 2008 and outputting the inverted signal; a NAND gate 2010 for receiving signals from the inverters 2004,2006,2008 and for outputting signals generated according to the NAND logic operation; a NAND gate 2011 for receiving signals from the inverters 2005,2006,2008 and for outputting signals generated according to the NAND logic operation; a NAND gate 2012 for receiving signals form the inverters 2004,2007,2008 and for outputting signals generated according to the NAND logic operation; a NAND gate 2013 for receiving signals from the inverters 2005,2007,2008 and for outputting signals generated according to the NAND logic operation; a NAND gate 2014 for receiving signals from the inverters 2004,2006,2009 and for outputting signals generated according to the NAND logic operation; a NAND gate 2015 for receiving signals from the inverters 2005,2006,2009 and for outputting signals generated according to the NAND logic operation; a NAND gate 2016 for receiving signals from the inverters 2004,2007,2009 and for outputting signals generated according to the NAND logic operation; and a NAND gate 2017 for receiving signals from the inverters 2005,2007, 2009 and for outputting signals generated according to the NAND logic operation.

The row redundancy predecoder unit 2000 further comprises: a NAND gate 2001 for receiving the test mode signal TRACT from the test mode control unit 3000 and the row redundancy address signal TBX12 from the row redundancy address buffer unit 1500 and for outputting signals generated according to the NAND logic operation; an inverter 2002 for receiving and inverting a signal from the NAND gate 2001 and for outputting the inverted signal; an inverter 2003 for receiving and inverting a signal from the inverter 2002 and for outputting the inverted signal; a NOR gate 2018 for receiving the output signal from the NAND gate 2010 and the output signal from the inverter 2003 and for outputting a signal generated according to the NOR logic operation; an inverter 2019 for receiving and inverting a signal from the NOR gate 2018 and for outputting the inverted signal TREB<7>; a NOR gate 2020 for receiving the signal output from the NAND gate 2011 and the signal output from the inverter 2003 and for outputting a signal generated according to the NOR logic operation; an inverter 2021 for receiving and inverting the signal output from the NOR gate 2020 and for outputting the inverted signal TREB<6>; a NOR gate 2022 for receiving the signal output from the NAND gate 2012 and the signal output from the inverter 2003 and for outputting a signal generated according to the NOR logic operation; an inverter 2023 for receiving and inverting the signal output from the NOR gate 2022 and for outputting the inverted signal TREB<5>; a NOR gate 2024 for receiving the signal output from the NAND gate 2013 and the signal output from the inverter 2003 and for outputting a signal generated according to the NOR logic operation; an inverter 2025 for receiving and inverting the signal output from the NOR gate 2024 and for outputting the inverted signal TREB<4>; a NOR gate 2026 for receiving the signal output from the NAND gate 2014 and the signal output from the inverter 2003 and for outputting a signal generated according to the NOR logic operation; an inverter 2027 for receiving and inverting the signal output from the NOR gate 2026 and for outputting the inverted signal TREB<3>; a NOR gate 2028 for receiving the signal output from the NAND gate 2015 and the signal output from the inverter 2003 and for outputting a signal generated according to the NOR logic operation; an inverter 2029 for receiving and inverting the signal output from the NOR gate 2028 and for outputting the inverted signal TREB<2>; a NOR gate 2030 for receiving the signal output from the NAND gate 2016 and the signal output from the inverter 2003 and for outputting a signal generated according to the NOR logic operation; an inverter 2031 for receiving and inverting the signal output from the NOR gate 2030 and for outputting the inverted signal TREB<1>; a NOR gate 2032 for receiving the signal output from the NAND gate 2017 and the signal output from the inverter 2003 and for outputting a signal generated according to the NOR logic operation; and an inverter 2033 for receiving and inverting the signal from the NOR gate 2032 and for outputting the inverted signal TREB<0>.

When the test mode signal TRACT generated at the test mode control unit 3000 is activated to be at 'high' level, one of the row redundancy predecoder signals TREB<0:7> is generated to be at 'low' level by the row address data signals BXB<0:2> received from the row address buffer unit 1400. Here, the row redundancy enable signal generating unit 2400 is operated based on the row redundancy predecoder signals TREB<0:7> having 'low' signals, thereby generating signals to drive the redundancy word lines of the redundancy memory cell array unit 5200. When the test mode signal TRACT generated at the test mode control unit 3000 is 'low', all of the row redundancy predecoder signals TREB<0:7> become 'high', thereby not driving the redundancy word lines of the redundancy memory cell array unit 5200.

Figure 13:
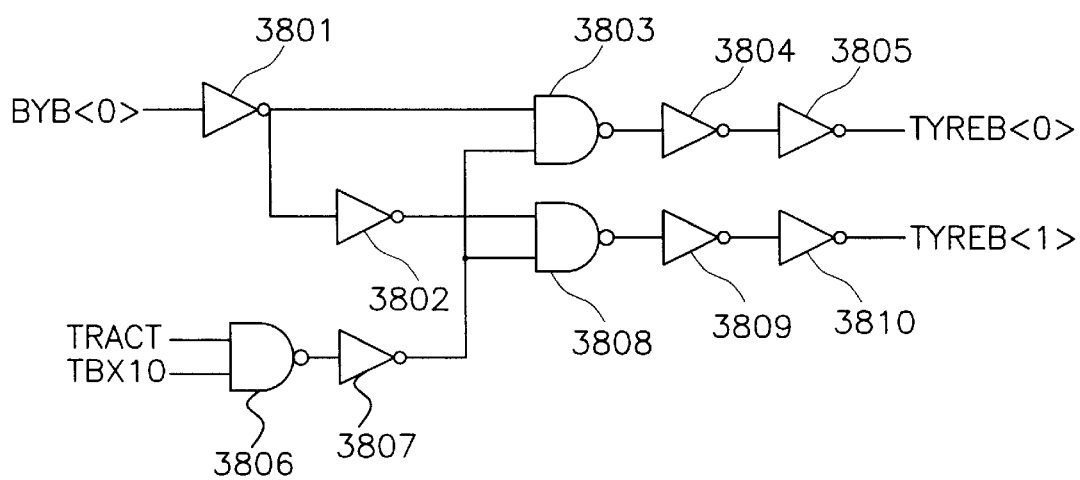
FIG. 13 is a circuit diagram of a column redundancy predecoder unit of the device illustrated in FIG. 9 according to an embodiment of the present invention.

FIG. 13 is a circuit diagram of the column redundancy predecoder unit 3800 of the present invention illustrated in FIG. 9. The column redundancy predecoder unit 3800 comprises: a NAND gate 3806 for receiving test mode signal TRACT from the test mode control unit 3000 and the column redundancy address signal TBY10 from the column address buffer unit 3300 and for outputting a signal generated according to the NAND logic operation; an inverter 3807 for receiving and inverting the signal output from the NAND gate 3806 and for outputting the inverted signal; an inverter 3801 for receiving and inverting a signal BYB<0> from the column address buffer unit 3200 and for outputting the inverted signal; a NAND gate 3803 for receiving the signal output from the inverter 3801 and the signal output from the inverter 3807 and for outputting a signal generated according to the NAND logic operation; an inverter 3804 for receiving and inverting the signal output from the NAND gate 3803 and for outputting the inverted signal; and an inverter 3805 for receiving and inverting the signal output from the inverter 3804 and for outputting the inverted signal TYREB<0>.

The column redundancy predecoder unit 3800 further comprises: an inverter 3802 for receiving and inverting the signal output from the inverter 3801 and for outputting the inverted signal; a NAND gate 3808 for receiving the signal output from the inverter 3802 and the signal output from the inverter 3807 and for outputting a signal generated according to the NAND logic operation; an inverter 3809 for receiving and inverting the signal output from the NAND gate 3808 and for outputting the inverted signal; and an inverter 3810 for receiving and inverting the signal output from the inverter 3809 and for outputting the inverted signal TYREB<1>.

When the test mode signal TRACT from the test mode control unit 3000 is activated to be at a 'high' level, one of the column redundancy predecoder signals TYREB<0:1> becomes 'low' according to the BYB<0> signal received from the column address buffer unit 3200. Here, the column redundancy enable signal generating unit 4200 is operated based on the column redundancy predecoder signals TYREB<0:1> having 'low' levels, thereby generating signals to drive the redundancy column line of the redundancy memory cell array unit 5200. When the test mode signal TRACT generated at the test mode control unit 3000 is at a 'low' level, all of the column redundancy predecoder signals TYREB<0:1> become 'high', thereby not driving the redundancy column line of the redundancy memory cell array unit 5200.

Figure 14:
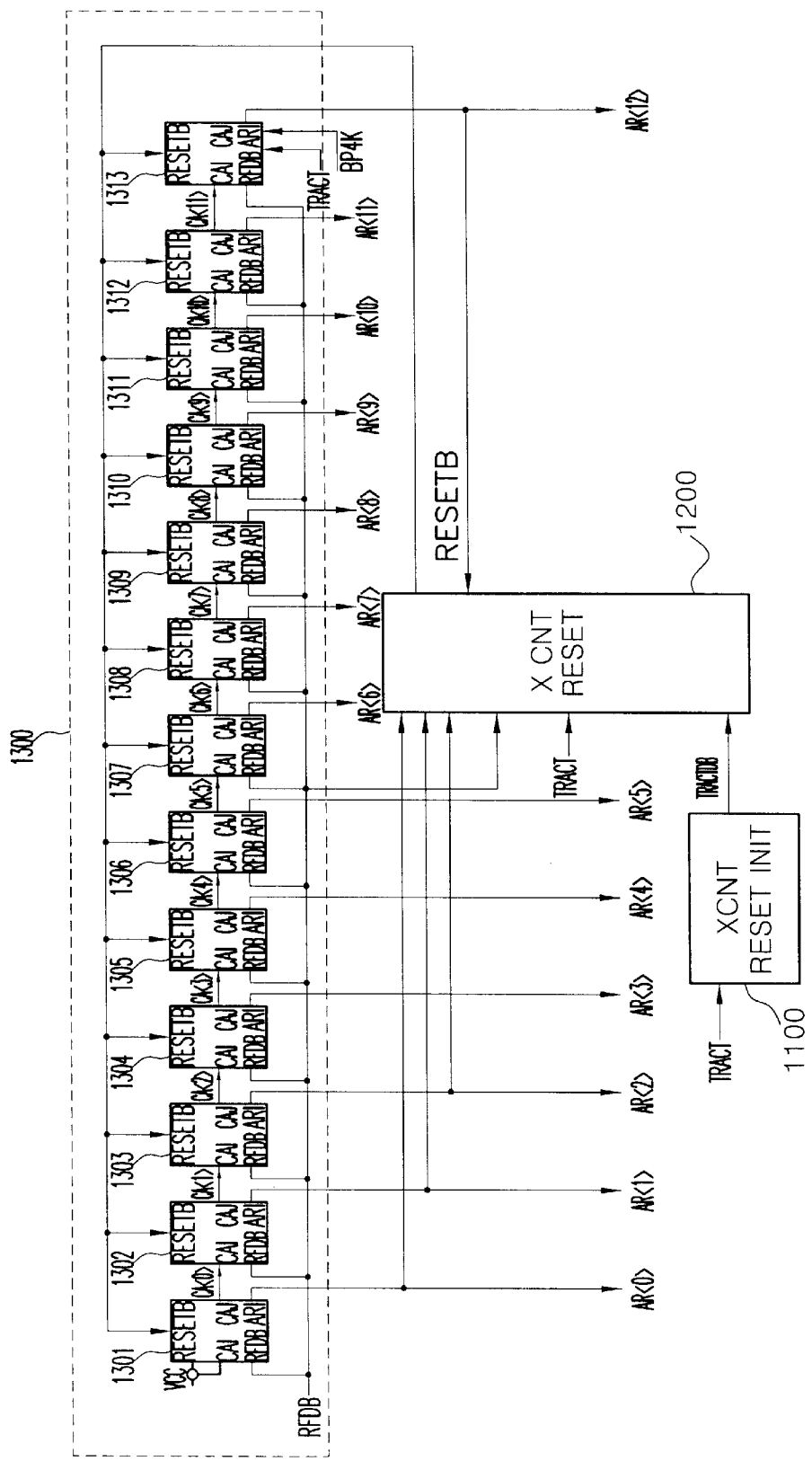
FIG. 14 is a diagram of a row counter reset initialization unit, a row counter reset unit and a row address counter unit of the device illustrated in FIG. 9 according to an embodiment of the present invention.

FIG. 14 is a block diagram of the row counter reset initialization unit 1100, the row counter reset unit 1200 and the row address counter unit 1300 of the present invention illustrate in FIG. 9.

Referring to FIG. 14, the row counter reset initialization unit 1100 receives the test mode signal TRACT from the test mode control unit 3000 and generates an initialization signal TRACTDB to initialize the row counter reset unit 1200.

The row counter reset unit 1200 is motivated by the test mode signal TRACT from the test mode control unit 3000 and RASB, and thereby receives a signal RFDB toggling from 'high' to 'low' once in a refresh operation to one word line and row address counter signals AR<0,1,2,12> to generate a reset signal RESETB to the row address counter unit 1300.

The row address counter unit 1300 receives the test mode signal TRACT from the test mode control unit 3000, RFDB motivated by the RASB signal and toggling from 'high' to 'low' once in the refresh operation to one word line, BP4K outputted from the command decoder (not shown) in the refresh mode, and the reset signal RESETB from the row counter reset unit 1200, thereby generating row address counter signals AR<0:12>.

The row address counter unit 1300 comprises: a first counter register 1301 for receiving the source voltage Vcc as a carry signal CAi, RFDB as a toggle signal and the reset signal RESETB from the row counter reset unit 1200 as a reset input signal REESTB and for generating a row address counter signal AR<0> and a carry signal CA<0>; a second counter register 1302 for receiving the carry signal CA<0> generated at the first counter register 1301 as a carry signal CAi, RFDB as a toggle signal and the reset signal RESETB from the row counter reset unit 1200 as a reset input signal REESTB and for generating a row address counter signal AR<1> and a carry signal CA<1>; a third counter register 1303 for receiving the carry signal CA<1> generated at the second counter register 1302 as a carry signal CAi, RFDB as a toggle signal and the reset signal RESETB from the row counter reset unit 1200 as a reset input signal REESTB and for generating a row address counter signal AR<2> and a carry signal CA<2>; a fourth counter register 1304 for receiving the carry signal CA<2> generated at the third counter register 1303 as a carry signal CAi, RFDB as a toggle signal and the reset signal RESETB from the row counter reset unit 1200 as a reset input signal REESTB and for generating a row address counter signal AR<3>; and a carry signal CA<3>; a fifth counter register 1305 for receiving the carry signal CA<3> as a carry signal CAi, RFDB as a toggle signal and the reset signal RESETB from the row counter reset unit 1200 as a reset input signal REESTB and for generating a row address counter signal AR<4> and a carry signal CA<4>; a sixth counter register 1306 for receiving the carry signal CA<4> generated at the fifth counter register 1305 as a carry signal CAi, RFDB as a toggle signal and the reset signal RESETB from the row counter reset unit 1200 as a reset input signal REESTB and for generating a row address counter signal AR<5> and a carry signal CA<5>; a seventh counter register 1307 for receiving the carry signal CA<5> generated at the sixth counter register 1306 as a carry signal CAi, RFDB as a toggle signal and the reset signal RESETB from the row counter reset unit 1200 as a reset input signal REESTB and for generating a row address counter signal AR<6> and a carry signal CA<6>; and an eighth counter register 1308 for receiving the carry signal CA<6> generated at the seventh counter register 1307 as a carry signal CAi, RFDB as a toggle signal and the reset signal RESETB from the row counter reset unit 1200 as a reset input signal REESTB and for generating a row address counter signal AR<7> and a carry signal CA<7>.

The row address counter unit 1300 further comprises: a ninth counter register 1309 for receiving the carry signal CA<7> generated at the eighth counter register 1308 as a carry signal CAi, RFDB as a toggle signal and the reset signal RESETB from the row counter reset unit 1200 as a reset input signal REESTB and for generating a row address counter signal AR<8> and a carry signal CA<8>; a tenth counter register 1310 for receiving the carry signal CA<8> generated at the ninth counter register 1309 as a carry signal CAi, RFDB as a toggle signal and the reset signal RESETB from the row counter reset unit 1200 as a reset input signal REESTB and for generating a row address counter signal AR<9> and a carry signal CA<9>; an eleventh counter register 1311 for receiving the carry signal CA<9> generated at the tenth counter register 1310 as a carry signal CAi, RFDB as a toggle signal and the reset signal RESETB from the row counter reset unit 1200 as a reset input signal REESTB and for generating a row address counter signal AR<10> and a carry signal CA<10>; a twelfth counter register 1312 for receiving the carry signal CA<10> generated at the eleventh counter register 1311 as a carry signal CAi, RFDB as a toggle signal and the reset signal RESETB from the row counter reset unit 1200 as a reset input signal REESTB and for generating a row address counter signal AR<11> and a carry signal CA<11>; and a thirteenth counter register 1313 for receiving the carry signal CA<11> generated at the twelfth counter register 1312 as a carry signal CAi, RFDB as a toggle signal, the reset signal RESETB from the row counter reset unit 1200 as a reset input signal REESTB, and BP4K outputted from the command decoder by the test mode signal TRACT and the refresh mode and turning 'high' in the 4K refresh mode as a control signal and for generating a row address counter signal AR<12>.

For the refresh operation of the redundancy memory cell in a test mode TRACT='high', when the row address counter signal AR<12> is 'low', the refresh operation is performed to a normal memory cell section and when the row address counter signal AR<12> is 'high', the refresh operation is performed to a redundancy memory cell section. That is, the memory operation having a 8K refresh cycle becomes a refresh operation of 8 redundancy word lines to 4K normal word line in a test mode and the row address signal A<12> is employed after being changed into the separation function of a normal memory cell area and a redundancy memory cell area.

Figure 15:
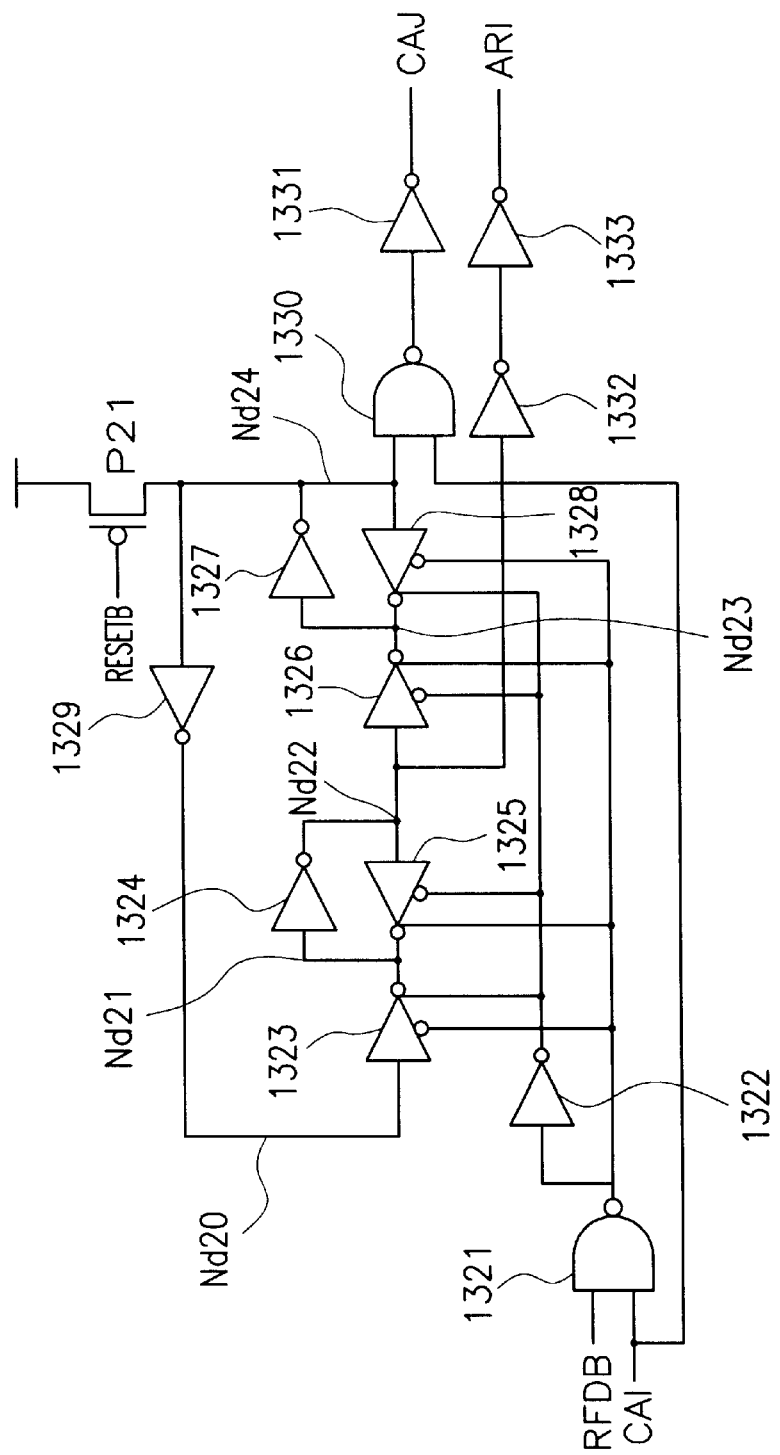
FIG. 15 is a circuit diagram of first to twelfth row counter register units of the row address counter unit illustrated in FIG. 14 according to an embodiment of the present invention.

FIG. 15 is a circuit diagram of each of the first to twelfth row counter registers 1301 to 1312 of the row address counter unit 1300 of the present invention illustrated in FIG. 14. Each of the counter registers 1301 to 1312 comprises: a NAND gate 1321 for receiving the signal RFDB and the carry signal CAI and for generating a signal generated according to the NAND logic operation; an inverter 1322 for receiving and inverting the signal output from the NAND gate 1321 and for outputting the inverted signal; a clock inverter 1323 for transmitting the signal of a node Nd20 to a node Nd21 under control of the output signal of the inverter 1322 and an output signal of the NAND gate 1321; an inverter 1324 for receiving and inverting the signal output from the node Nd21 and for outputting the inverted signal to a node Nd22; a clock inverter 1325 for receiving and inverting the signal of the node Nd22 under control of the signals output from the inverter 1322 and the NAND gate 1321 and for outputting the inverted signal to the node Nd21; a clock inverter 1326 for receiving and inverting the signal of the node Nd22 under control of the signal from the inverter 1322 and signal from the NAND gate 1321 and for outputting the inverted signal to the node Nd23; an inverter 1327 for receiving and inverting the signal output from the node Nd23 and for outputting the inverted signal to a node Nd24; a clock inverter 1328 for receiving and inverting the signal of the node Nd24 under control of the signal output from the inverter 1322 and the signal output from the NAND gate 1321 and for outputting the inverted signal to the node Nd23; a NAND gate 1330 for receiving the signal from the node Nd24 and the carry signal CAI and for outputting a signal generated according to the NAND logic operation; an inverter 1331 for receiving and inverting the signal output from the NAND gate 1330 and for outputting the inverted signal CAJ; an inverter 1332 for receiving and inverting the signal from the node Nd22 and for outputting the inverted signal; an inverter 1333 for receiving and inverting the signal output from the inverter 1332 and for outputting the inverted signal ARI; an inverter 1329 for receiving and inverting the signal output from the node Nd24 and for outputting the inverted signal to the node Nd20; and a PMOS transistor P21 for transmitting the source voltage Vcc to the node Nd24 according to the reset signal RESETB output from the row counter reset unit 1200.

The first to the twelfth row counter registers 1301 to 1312 of the row address counter unit 1300 further comprise the reset signal RESETB supplied typically to conventional row counter registers.

Figure 16:
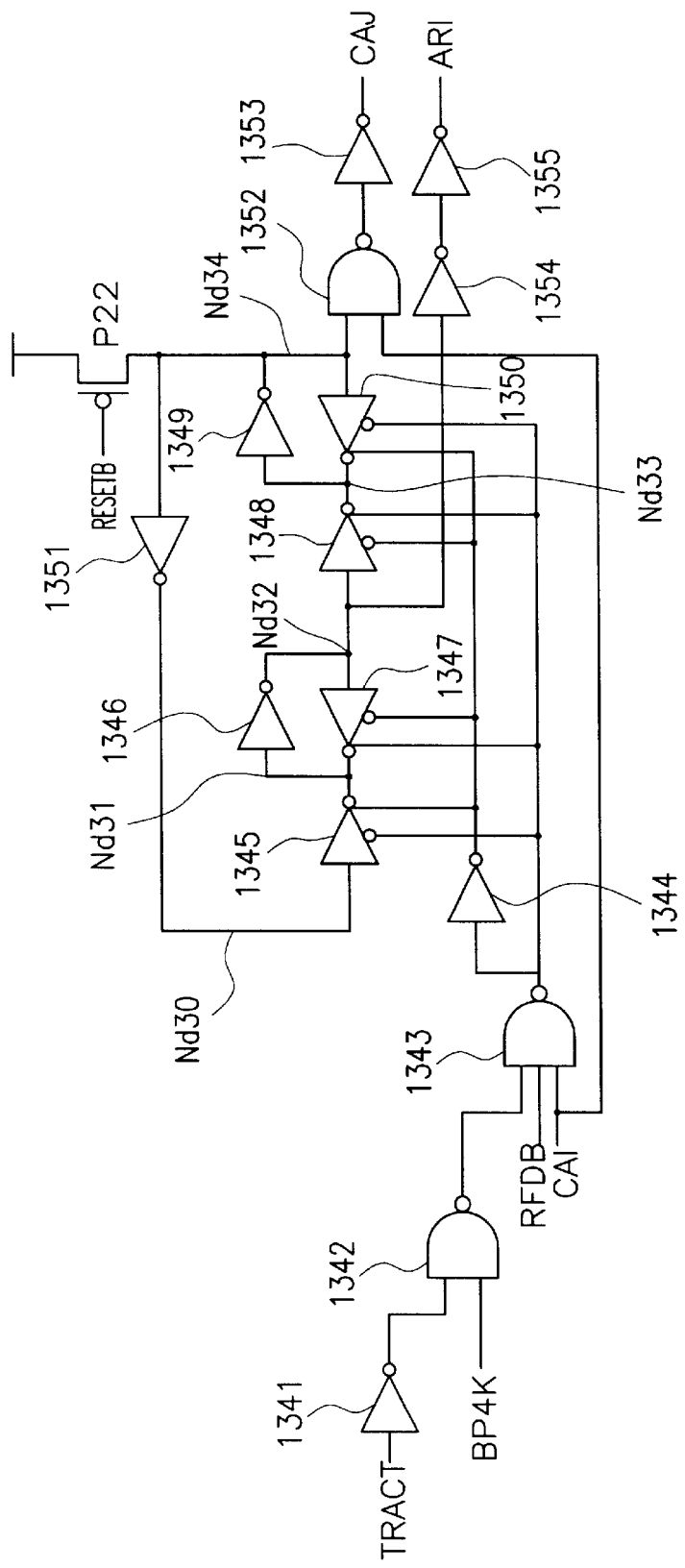
FIG. 16 is a circuit diagram of a thirteenth row counter register unit of the row address counter unit in FIG. 14 according to an embodiment of the present invention.

FIG. 16 is a circuit diagram of the thirteenth row counter register 1313 of the row address counter unit 1300 of the present invention illustrated in FIG. 14, which comprises: an inverter 1341 for receiving and inverting the test mode signal TRACT from the test mode control unit 3000 and for outputting the inverted signal; a NAND gate 1342 for receiving the signal output from the inverter 1341 and BP4K outputted from the command decoder by the refresh mode and having a 'high' level in the 4K refresh mode and for outputting a signal generated according to the NAND logic operation; a NAND gate 1343 for receiving the signal output from the NAND gate 1342, RFDB and the carry signal CAI and for outputting a signal generated according to the NAND logic operation; an inverter 1344 for receiving and inverting the signal output from the NAND gate 1343 and for outputting the inverted signal; a clock inverter 1345 for transmitting the signal of a node Nd30 to a node Nd31 based on the output signal of the inverter 1344 and the output signal of the NAND gate 1343; and an inverter 1346 for receiving and inverting the signal output from the node Nd31 and for outputting the inverted signal to a node Nd32.

The thirteenth row counter register 1313 further comprises: a clock inverter 1347 for receiving and inverting the signal of the node Nd32 based on the signal from the inverter 1344 and the signal from the NAND gate 1343 and for outputting the inverted signal to the node Nd31; a clock inverter 1348 for receiving and inverting the signal of the node Nd32 based on the signal from the inverter 1344 and the signal from the NAND gate 1343 and for outputting the inverted signal to the node Nd33; an inverter 1349 for receiving and inverting the signal output from the node Nd33 and for outputting the inverted signal to a node Nd34; a clock inverter 1350 for receiving and inverting the signal of the node Nd34 based on the signal from the inverter 1344 and the signal from the NAND gate 1343 and for outputting the inverted signal to the node Nd33; a NAND gate 1352 for receiving the signal output from the node Nd34 and the carry signal CAI and for outputting a signal generated according to the NAND logic operation; an inverter 1353 for receiving and inverting the signal from the NAND gate 1352 and for outputting the inverted signal CAJ; an inverter 1354 for receiving and inverting the signal from the node N32 and for outputting the inverted signal; an inverter 1355 for receiving and inverting the signal from the inverter 1354 and for outputting the inverted signal ARI; an inverter 1351 for receiving and inverting the signal from the node Nd24 and for outputting the inverted signal to the node Nd30; and a PMOS transistor P22 for applying the source voltage Vcc to the node Nd34 based on the reset signal RESETB from the row counter reset unit 1200.

The thirteenth row counter register 1313 of the row address counter unit 1300 further comprises a circuit for receiving the reset signal RESETB added to the conventional row counter register. The thirteenth row counter register 1313 is a register for the highest address and the row address counter signal AR<12> significant in 8K is generated in 4K refresh of the test mode and employed to separate the normal memory area and the redundancy memory area.

Figure 17:
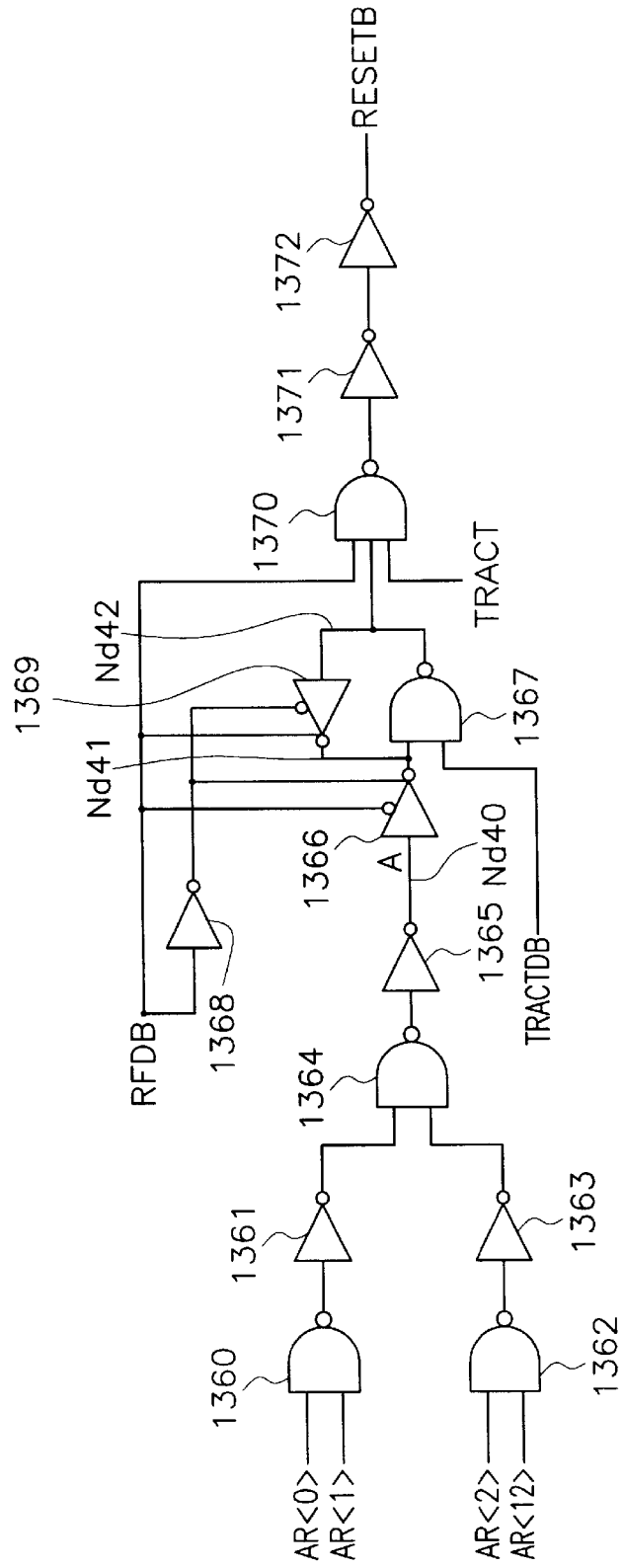
FIG. 17 is a circuit diagram of the row counter reset unit illustrated in FIG. 14 according to an embodiment of the present invention.

FIG. 17 is a circuit diagram of the row counter reset unit 1200 illustrated in FIG. 14, which comprises: a NAND gate 1360 for receiving row address counter signals AR<0> and AR<1> from the row address counter unit 1300 and for outputting a signal generated according to the NAND logic operation; an inverter 1361 for receiving and inverting the signal output from the NAND gate 1360 and for outputting the inverted signal; a NAND gate 1362 for receiving row address counter signals AR<2> and AR<12> from the row address counter unit 1300 and for outputting a signal generated according to the NAND logic operation; an inverter 1363 for receiving and inverting the signal output from the NAND gate 1362 and for outputting the inverted signal; a NAND gate 1364 for receiving the signal from the inverter 1361 and the signal from the inverter 1363 and for outputting a signal generated according to the NAND logic operation; and an inverter 1365 for receiving and inverting the signal output from the NAND gate 1364 and for outputting the inverted signal to a node Nd40.

The row counter reset unit 1200 further comprises: an inverter 1368 for receiving and inverting the RFDB signal motivated by the signal RASB and toggling from 'high' to 'low' once in the refresh operation to one word line and for outputting the inverted signal; a clock inverter 1366 for receiving and inverting the signal from the node Nd40 based on the signal RFDB and the inverted RFDB and for outputting the inverted signal to a node Nd41; a NAND gate 1367 for receiving the signal of the node Nd41 and the reset initialization signal TRACTDB from the row counter reset initialization unit 1100 and for outputting a signal generated according to the NAND logic operation to a node Nd42; a clock inverter 1369 for receiving and inverting the signal output from the NAND gate 1367 (Nd42) based on the RFDB and the inverted RFDB and for outputting the inverted signal to the node Nd41; a NAND gate 1370 for receiving the RFDB, the signal of the node Nd42 and the test mode signal TRACT from the test mode control unit 3000 and for outputting a signal generated according to the NAND logic operation; an inverter 1371 for receiving and inverting the signal output from the NAND gate 1370 and for outputting the inverted signal; and an inverter 1372 for receiving and inverting the signal output from the inverter 1371 and for generating the inverted row counter reset signal RESETB.

Figure 18:
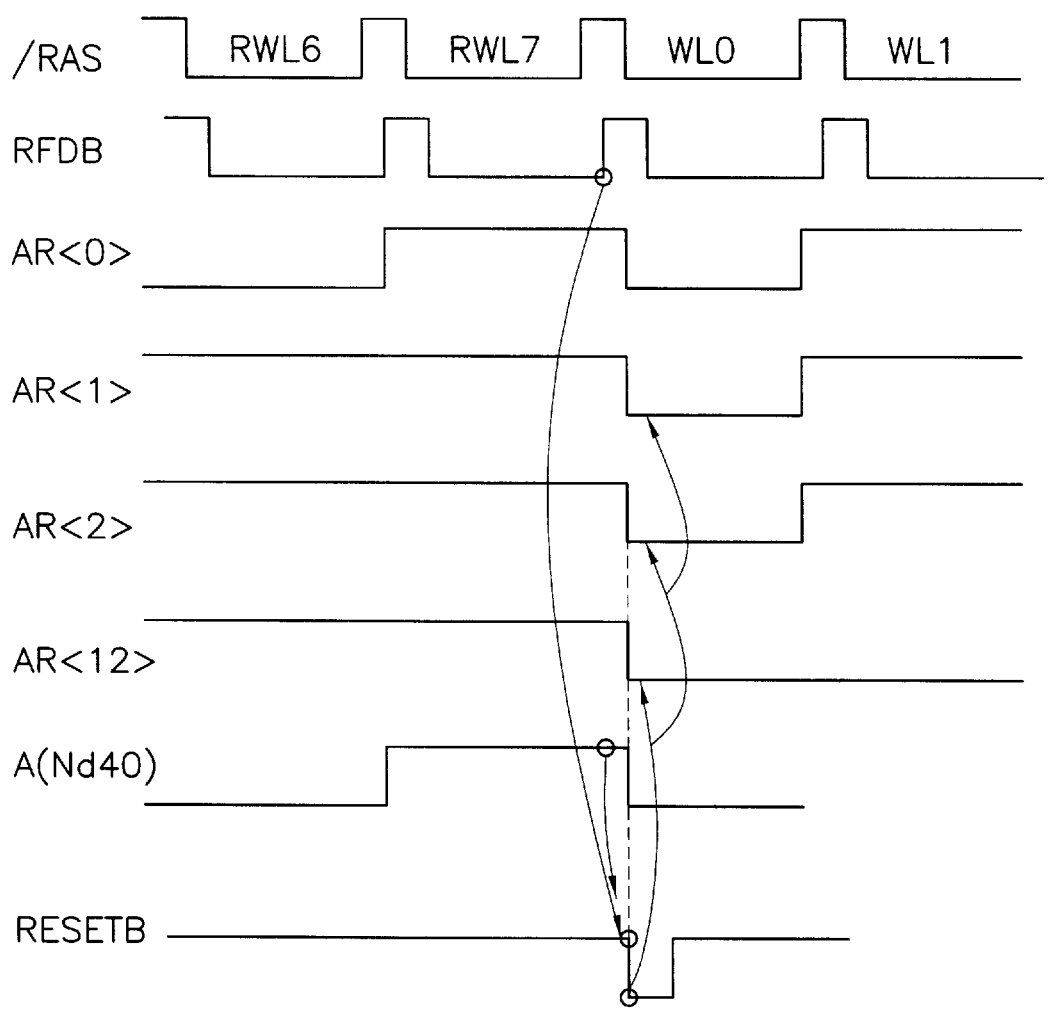
FIG. 18 is a diagram for showing the operation of the row counter reset unit illustrated in FIG. 17 according to an embodiment of the present invention.

The operation of the row counter reset unit 1200 will be described with reference to operation timing illustrated in FIG. 18. In a test mode TRACT, the highest row address counter signal AR<12> becomes 'low' and then a refresh operation is performed on the normal memory cell array unit 5000. Then, when the highest row address counter signal AR<12> becomes 'high', a refresh operation is performed on the redundancy memory cell array unit 5200. When the refresh operation applied to the redundancy word lines of the redundancy memory cell array unit 5200 is completed, a reset signal RESETB ('low') is generated from the row counter reset unit 1200, thereby resetting the first to the thirteenth row counter registers 1301~1313. That is, all of the row address counter signals AR<0:12> become 'low' and thereby restart the refresh operation on a first word line of the normal memory cell array unit 5000.

Figure 19:
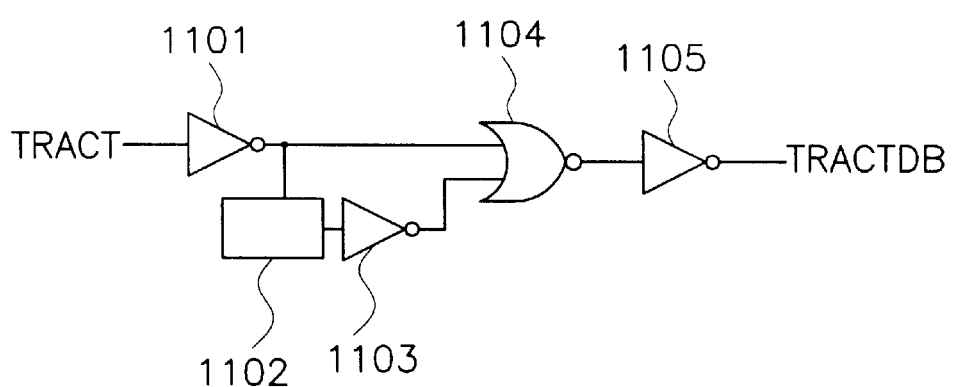
FIG. 19 is a circuit diagram of the row counter reset initialization unit illustrated in FIG. 14 according to an embodiment of the present invention.

FIG. 19 is a circuit diagram of the row counter reset initialization unit 1100 illustrated in FIG. 14, which comprises: an inverter 1101 for receiving and inverting the test mode signal TRACT from the test mode control unit 300 and for outputting the inverted signal; a delay terminal 1102 for receiving and delaying the signal output from the inverter 1101 for a predetermined time duration and for outputting the delayed signal; an inverter 1103 for receiving and inverting the signal output from the delay terminal 1102 and for outputting the inverted signal; a NOR gate 1104 for receiving signal from the inverter 1101 and the signal output from the inverter 1103 and for outputting a signal generated according to the NOR logic operation; and an inverter 1105 for inverting the signal received from the NOR gate 1104 and thereby generating the initialization signal TRACTDB.

The row counter reset initialization unit 1100 performs an operation to initialize latching of the row counter reset unit 1200 in entering the test mode TRACT='high'.

The semiconductor memory device having the redundancy circuit as described above according to the present invention will be described. First, a general memory cell operation is divided by refresh modes. For example, 64M bit memory comprising 16 I/O is divided into 4K and 8K refresh modes. In the 8K refresh mode, 13 row addresses A0~A12 and 9 column addresses A0~A8 are employed. In the 4K refresh mode, 12 row addresses A0~A11 and 10 column addresses A0~A9 are employed. Therefore, a method has been proposed that when a memory is fabricated, the memory is manufactured to be supported by 8K and 4K operations and then, to be followed by bonding or metal option. As a result, although the memory may be manufactured for the 8K operation, it is also appropriate for the 4K operation. In the present invention, it is set for a 4K operation and then is employed for separation of the normal memory cell area and redundancy memory cell area by using the highest address (A12 in row and A10 in column).

Figure 20:
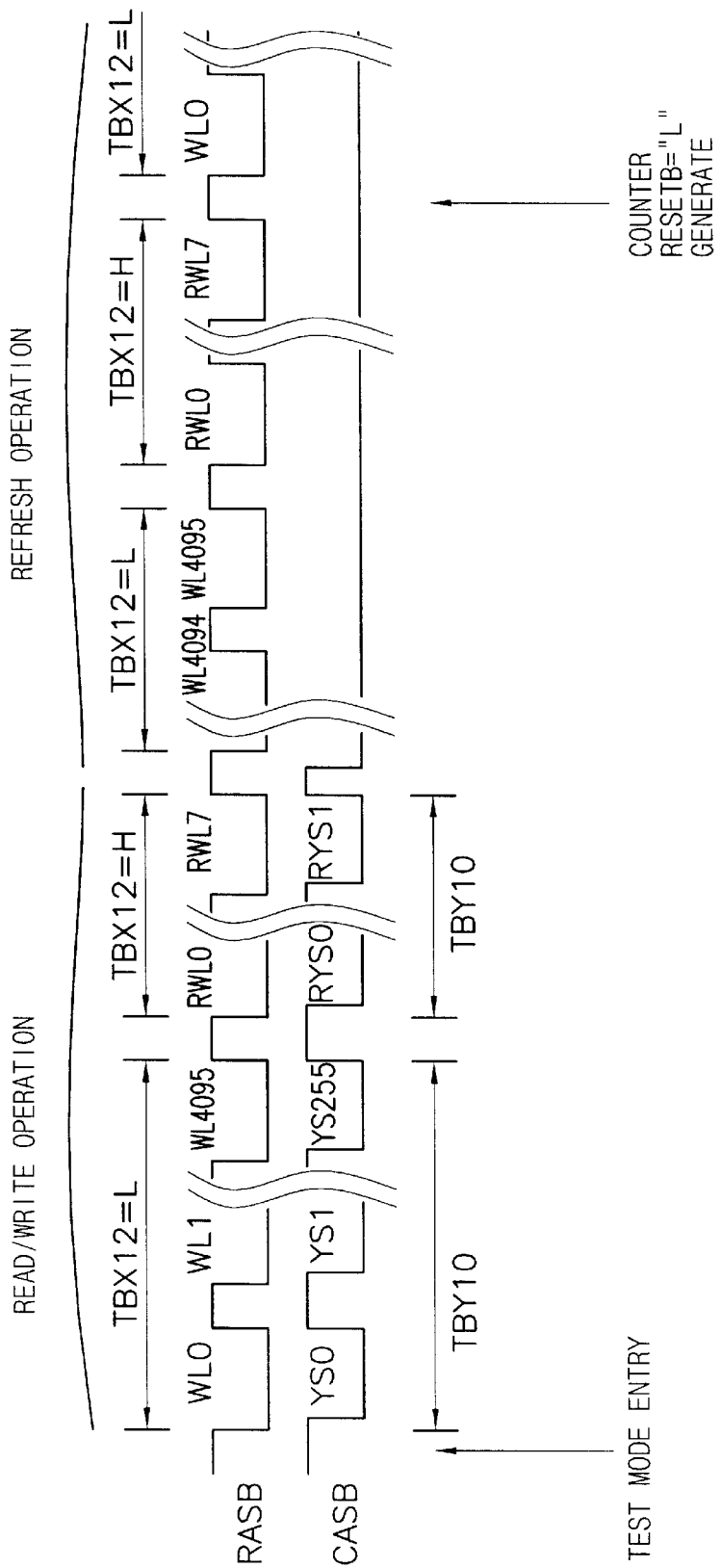
FIG. 20 is a diagram for showing the operation of a test mode signal outputted from the test mode control unit illustrated in FIG. 9 according to an embodiment of the present invention.

FIG. 20 is a drawing for showing an operation to test the redundancy memory cell array unit 5200 according to an embodiment of the present invention. In a test mode for testing both the normal memory cell array unit 5000 and the redundancy memory cell array unit 5200, first, an 8K product is changed into a 4K product and then, enters the test mode TRACT. After entering the test mode TRACT, a test is performed by separating a normal memory cell area and a redundancy memory cell area using address data from an outside source. That is, when the highest row address signal A<12> received from outside in driving the word lines with a row address is at a 'low' level, then the normal memory cell array unit 5000 is tested. But when the highest row address signal A<12> is at a 'high' level, then the redundancy memory cell array unit 5200 is tested.

In other words, in the row redundancy address buffer unit 1500 illustrated in FIG. 10, when a 'high' test mode signal TRACT from the test mode control unit 3000 is applied thereto, then the row redundancy address data signal TBX12 becomes 'low' or 'high' according to the highest row address signal A12 received from the address buffer unit 1000. Here, when the row redundancy address data signal TBX12 is 'low', it means the normal memory cell area is to be used and, therefore, in a test mode TRACT, signals TREB<0:7> generated at the row redundancy predecoder unit 2000 become 'high', thereby not driving redundancy word lines.

On the other hand, when the row redundancy address data signal TBX12 generated at the row redundancy address buffer unit 1500 is 'high', one of the signals TREB<0:7> generated at the row redundancy predecoder unit 2000 becomes 'low' according to the row address data signal generated at the row address buffer unit 1400. When one of the signals TREB<0:7> is 'low', the row redundancy enable signal generating unit 2400 for receiving the signals TREB<0:7> generated from the row redundancy predecoder unit 2000 generates row redundancy enable generating signal RWL<0:7> for driving the word lines of the redundancy memory cell area.

As a result, in a row operation of the present invention, when the row redundancy address data signal TBX12 generated at the row redundancy address buffer unit 1500 is 'low', the word lines of the normal memory cell array unit 5000 are selected and when the signal TBX12 is 'high', then the redundancy word lines of the redundancy memory cell array unit 5200 are selected.

Next, the column operation of the present invention will be described with reference to the column redundancy address buffer unit 3300 illustrated in FIG. 11. When a 'high' test mode signal TRACT is applied thereto from the test mode control unit 3000, the column redundancy address data signal TBY10 becomes 'low' or 'high' according to the highest column address signal A10 received from the address buffer unit 1000. Here, when the column redundancy address data signal TBY10 is 'low', the column line of the normal memory cell array unit 5000 is selected and, therefore, in a test mode TRACT, signals TYREB<0:1> generated at the column redundancy predecoder unit 3800 become 'high', thereby not driving a redundancy column line.

On the other hand, when the column redundancy address data signal TBY10 generated at the column redundancy address buffer unit 3300 is 'high', one of the signals TYREB<0:1> generated at the column redundancy predecoder unit 3800 becomes 'low' according to column address data signals BYB<0:7> generated at the column address buffer unit 3200. When one of the signals TYREB<0:1> received becomes 'low', then the column redundancy enable signal generating unit 4200 for receiving the signals TYREB<0:1> from the column redundancy predecoder unit 3800 generates column redundancy enable signal RYS<0:1> for driving a redundancy column line of the redundancy memory cell array unit 5200.

As a result, in a column operation of the present invention, when the column redundancy address data signal TBY10 generated at the column redundancy address buffer unit 3300 is 'low', the column lines of the normal memory cell array unit 5000 are selected and when it is 'high', the redundancy column lines of the redundancy memory cell array unit 5200 are selected.

The operation of the redundancy circuit according to the semiconductor memory device of the present invention will be described by 4 operation sections.

First, read/write operations not in a test mode (TRACT='low') will be described. In this section, BP4K outputted from the command decoder in the refresh operation is 'low' and the test mode signal TRACT from the test mode control unit 3000 is also 'low'. Therefore, an 8K refresh operation is performed and the highest address signal A<12> from the address buffer unit 1000 is transmitted to the row predecoder unit 1600 and to the row redundancy predecoder unit 2000 through the row redundancy address buffer unit 1500.

As illustrated in FIG. 10, in the 8K refresh operation, BP4K outputted from the command decoder in the refresh operation is 'low', the test mode signal TRACT from the test mode control unit 3000 is 'low', the control signal XLAT activated in operations except for refresh is 'high' and the control signal RLAT activated in the refresh operation is 'low'. Thus, the row redundancy address buffer unit 1500 generates the row redundancy address signal TBX12 and the row address data signal BXB<12> according to the highest address signal A<12> received from the address buffer unit 1000. Here, the row redundancy address data signal TBX12 is changed into 'high' or 'low' according to the highest row address signal A<12> received from the address buffer unit 1000. However, when the test mode signal TRACT is 'low', the row redundancy predecoder unit 2000 for receiving the row redundancy address data signal TBX12 is not affected by the row redundancy address data signal TBX12.

After the row address is applied, the highest column address signal A<10> from the address buffer unit 1000 is latched to the column address buffer unit 3200 by command/ signals CASB. And, the column predecoder unit 34000 and the column decoder unit 3600 are operated by the column address signal from the column address buffer unit 3200, thereby generating a column selection signal YS and data amplified by the sense amplification unit are transmitted to I/O based on the column selection signal YS. In the column redundancy address buffer unit 3300, transmission of address data is blocked between the column address signal A<10> the column redundancy address signal TBY10 since the test mode signal TRACT is 'low'. Therefore, the column redundancy address buffer unit 3300 is not operated when the device is not in a test mode.

Second, read/write operations in a test mode (TRACT= 'high') will be described. In a test mode of the present invention, the 8K refresh operation is changed into a 4K refresh operation and then performed, wherein BP4K becomes 'high' and the test mode signal TRACT of the present invention becomes 'high'.

Here, the operation of the NMOS transistor N1 shown in FIG. 10 is not affected by the row redundancy address buffer unit 1500 and controlled by the test mode signal TRACT. Therefore, the NMOS transistor N1 becomes turned off. As a result, the NMOS transistor N1 is capable of transmitting the highest row address signal A<12> received from the address buffer unit 1000. Here, the row redundancy address data signal BXB<12> is continuously maintained at 'low' level and therefore, in the 4K refresh operation, the highest row address signal A<12> significant in the 8K refresh is operated.

On the other hand, when the row redundancy address signal TBX12 generated at the row redundancy address buffer unit 1500 is 'high', the test mode signal TRACT is 'high'. Therefore, the row redundancy predecoder unit 2000 generates row redundancy predecoder signals TREB<0:7> by combining appropriately the row redundancy address data signals BXB<0:2>, thereby selecting the redundancy word lines of the redundancy memory cell array unit 5200. When the row redundancy address signal TBX12 generated at the row redundancy address buffer unit 1500 is 'low', the row redundancy predecoder signals TREB<0:7> become 'high', thereby not selecting the redundancy word lines of the redundancy memory cell array unit 5200. That is, in a test mode (TRACT='high'), the word lines of the normal memory cell array unit 5000 and the redundancy word lines of the redundancy memory cell array unit 5200 are selectively operated according to the highest row address signal A<12>.

After the row address signal is applied, when the test mode signal TRACT is 'high', the highest column redundancy address signal A<10> is transmitted as the column redundancy address signal TBY10 by the operation of the column redundancy address buffer unit 3300. When the column redundancy address signal TBY10 is 'high', the column redundancy predecoder unit 3800 receives the column redundancy address data signal BYB<0>, and thereby generates the column redundancy predecoding signals TYREB<0:1> for selecting the redundancy column lines of the redundancy memory cell array unit 5200. On the other hand, when the column redundancy address signal TBY10 is 'low', regardless of the column redundancy address data signal BYB<0>, the column redundancy predecoding signals TYREB<0:1> are disabled, thereby not selecting the redundancy column lines of the redundancy cell array unit 5200.

That is, in the test mode (TRACT='high'), the column lines of the normal memory cell array unit 5000 and the redundancy column lines of the redundancy memory cell array unit 5200 are selectively operated according to the highest column address signal A<10>.

Third, the refresh operation not in a test mode (TRACT= 'low') will be described according to the present invention. In this section, in the refresh operation, BP4K outputted from the command decoder is 'low' and the test mode signal TRACT from the test mode control unit 3000 is 'low', so that the 8K refresh operation is performed. In this refresh operation, regardless of address signals A<0:12> from the address buffer unit 1000, row address data signals BXB<0:12> are generated by the row address buffer unit 1400 based on the row address counter signals AR<0:12> generated at the row address counter unit 1300, and the row redundancy address signal TBX12 is generated by the row redundancy address buffer unit 1500. The row predecoder unit 1600 is controlled by the row address data signals BXB<0:12>, and thereby controls the word lines of the normal memory cell array unit 5000. The row redundancy predecoder unit 2000 is controlled by the row address data signal BXB<12> and the row redundancy address signal TBX12, and thereby controls the redundancy word lines of the redundancy memory cell array unit 5200.

Referring to the row address counter unit 1300 in FIG. 14, the row address counter signals AR<0:12> are generated by RFDB enabled in the refresh operation, and range from the lowest bit LSB of AR<0> to the highest bit MSB of AR<12>. As a result, in this case, $2^{13}$=8K word lines will be driven. The row address counter signals AR<0:12> generated at the row address counter unit 1300 are transmitted to the row address buffer unit 1400 and to the row redundancy address buffer unit 1500 as input and then latched by a signal RLAT generated in the refresh operation, whereby the decoding operation on the word lines is performed.

Fourth, the refresh operation in the test mode (TRACT= 'high') will be described according to the present invention. According to the redundancy circuit of the present invention, in a test mode, an 8K refresh operation is changed into a 4K refresh operation and then performed, whereby BP4K becomes 'high'. The test mode signal TRACT is 'high' into the test mode and the BFDB is 'high' in the refresh operation.

Therefore, the thirteenth counter register 1313 of the row address counter unit 1300 is driven by the BFDB, thereby generating the highest row address counter signal AR<12>. The highest row address counter signal AR<12> is applied to the row redundancy address buffer unit 1500, which generates the row redundancy address signal TBX12 based on the BP4K. The row redundancy address signal TBX12 is applied to the row redundancy predecoder unit 2000, which selects the redundancy word lines of redundancy memory cell array unit 5200 to perform the refresh operation as in read/write operations during a test mode. And, the row address counter signals AR<0:11> generated at the row address counter unit 1300 are also applied to the row address buffer unit 1400, thereby generating row address data signal BXB<0:12>. And, the row address data signals BXB<0:12> are applied to the row predecoder unit 1600, which selects the word lines of the normal memory cell array unit 5000 to perform the refresh operation.

In a test mode (TRACT='high'), the refresh operation is first performed on the normal memory cell array unit 5000 operating when the row address counter signal AR<12> is 'low'. Then, the refresh operation is performed on the redundancy memory cell array unit 5200 operating when the row address counter signal AR<12> is 'high'. This completes the refresh operation for 8 redundancy word lines. Then, the row counter reset signal RESETS becomes 'low', thereby resetting the first to the thirteenth counter registers 1301~1313 of the row address counter unit 1300. Therefore, all of the row address counter signals AR<0:12> become 'low' and the refresh operation onto the first word line of the normal memory cell array unit 5000 is restarted (refer to FIG. 18).

That is, the refresh operation is carried out on all redundancy word lines and then, the refresh operation is performed on the normal word lines. In the refresh operation, the operation for moving column lines is not performed since the word lines are moved.

Figure 21A:
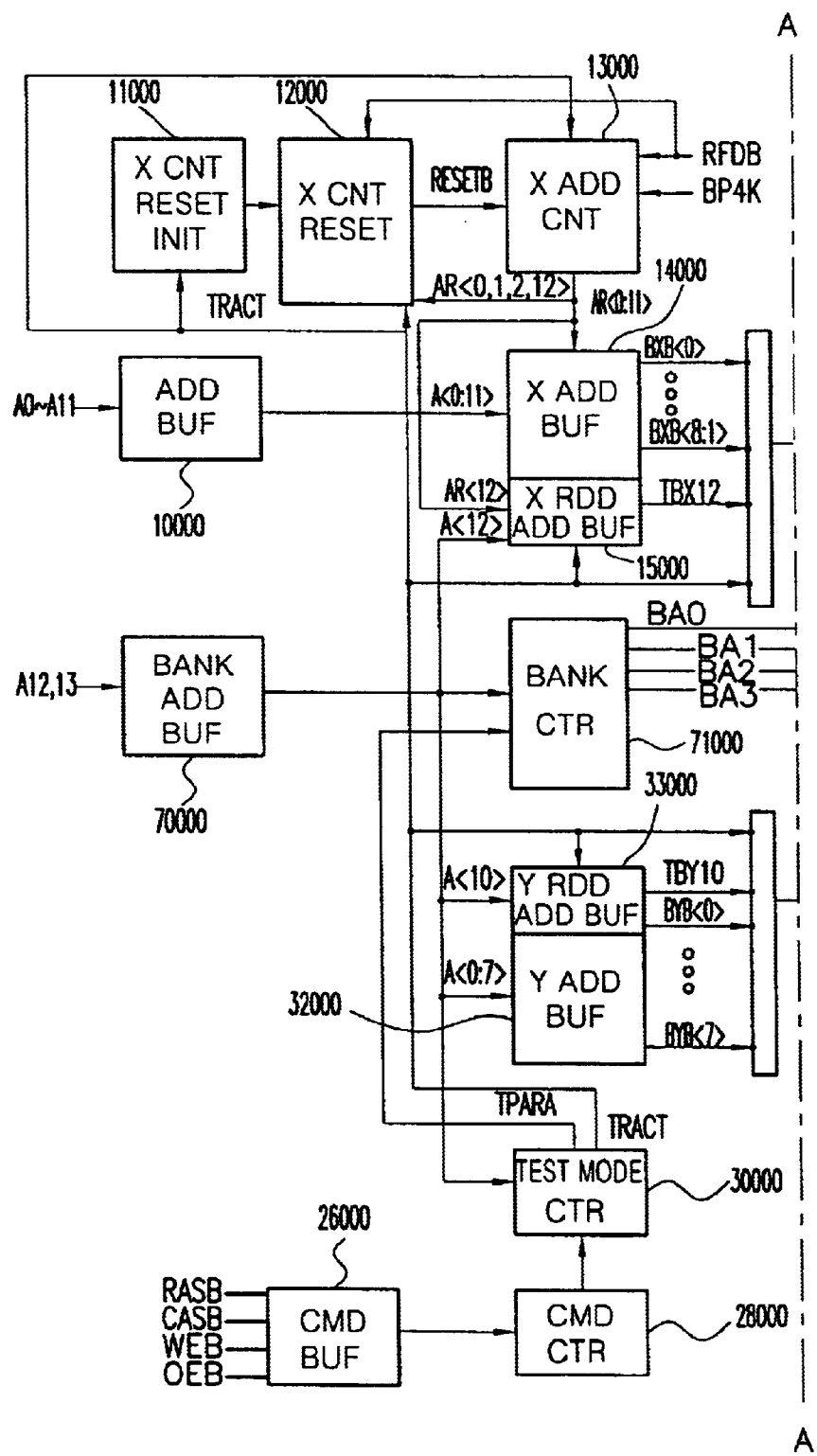
FIG. 21 is a block diagram of a semiconductor memory device having a redundancy circuit according to a second embodiment of the present invention.
Figure 21B:
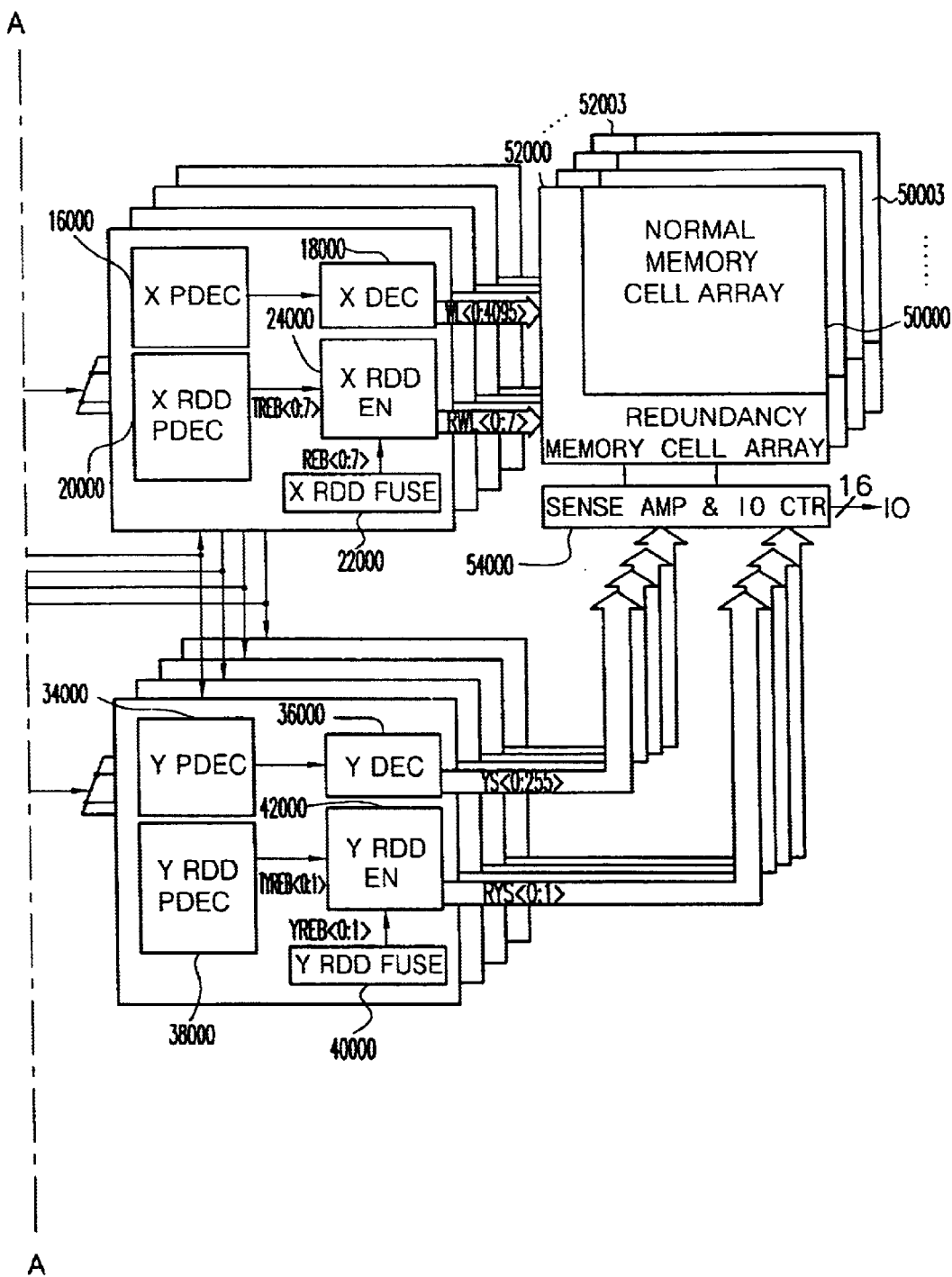

FIG. 21 is a block diagram of the semiconductor memory device having the redundancy circuit according to a second embodiment of the present invention, for showing a 64M bit memory device comprising 4 memory banks having the capacitance of 16M bit.

Referring to FIG. 21, the semiconductor memory device having the redundancy circuit of the present invention comprises: first to fourth normal memory cell array units (or a plurality of normal memory cell array units) 50000~50003 each having a memory bank of 16M; first to fourth redundancy memory cell array units (or a plurality of redundancy cell array units) 52000~52003 each having a memory bank of 1K bit for recovering defective cells of the first to fourth normal memory cell array unit 50000~50003; and first to fourth sense amplification unit and I/O control units 54000~54003 for sensing and amplifying read data received from the first to fourth normal memory cell array units 50000~50003 or from the first to fourth redundancy memory cell array units 52000~52003 and then outputting the amplified data to I/O line(s), or for sensing and amplifying read data received from the I/O line(s) and then outputting the amplified data to the first to fourth normal memory cell array units 50000~50003 or to the first to fourth redundancy memory cell array units 52000~52003.

The device further comprises: an address buffer unit 10000 for receiving address signals A0~A11 from an outside source; a command buffer unit 26000 for receiving commands such as RASB, CASB, WEB, OEB from an outside source; a command control unit 28000 for receiving the signals from the command buffer unit 26000; and a test mode control unit 30000 for generating a first test mode signal TRACT and a second test mode signal TPARA, receiving the signals from the command control unit 28000 and address signals A<0:11> from the address buffer unit 10000 and detecting defections of word lines and bit lines of the first to fourth redundancy memory cell array units 52000~52003.

The device further comprises: a row counter unit 13000 for receiving the first test mode signal TRACT from the test mode control unit 30000, a signal RFDB based on the command signal RASB and toggling from 'high' to 'low' once in a refresh operation to one word line, and a signal BP4K generated at a command decoder (not shown) in the refresh operation and for generating row address counter signals AR<0:12>; a row counter reset unit 12000 for receiving the first test mode signal TRACT from the test mode control unit 30000, the toggle signal RFDB and row address counter signals AR<0,1,2,12> from the row address counter unit 13000 and for generating a reset signal RESETB to the row address counter unit 13000; and a row counter reset initialization unit 11000 for receiving the first test mode signal TRACT from the test mode control unit 30000 and for generating an initialization signal TRACTDB to the row counter reset unit 12000.

The device further comprises: a row address buffer unit 14000 for receiving address signals A<0:11> from the address buffer unit 10000 and the row address counter signal AR<0:12> from the row address counter unit 13000 and for generating row address data signal BXB<0:11>; first to fourth row predecoder units 16000~16003 each for receiving row address data signals BXB<0:11> from the row address buffer unit 14000 and for generating decoded signals; and first to fourth row decoder units 18000~18003 each for decoding signals received from the corresponding one of the first to fourth row predecoder units 16000~16003 and for generating signals WL<0:4095> to select word lines of the corresponding one of the first to fourth normal memory cell array units 50000~50003.

The device further comprises: a row redundancy buffer unit 15000 for receiving the highest row address signal A<12> from the address buffer unit 10000, the first test mode signal TRACT from the test mode control unit 30000 and the row address counter signals AR<0:12> from the row address counter unit 13000 and for generating a row redundancy address signal TBX12; first to fourth row redundancy predecoder units 20000~20003 each for receiving the row address data signals BXB<0:12> from the row address buffer unit 14000, the test mode signal TRACT from the test mode control unit 30000 and the row redundancy address signal TBX12 from the row redundancy address buffer unit 1500 and for generating decoded signals TREB<0:7>; first to fourth row redundancy fuse units 22000~22003 each for generating programmed row redundancy data signals REB<0:7>; and first to fourth row redundancy enable signal generating units 24000~24003 each for receiving the decoded signal TREB<0:7> from the corresponding one of the first to fourth row redundancy predecoder units 20000~20003 and the programmed row redundancy data signal REB<0:7> from the corresponding one of the first to fourth row redundancy fuse units 22000~22003 and for generating signals RWL<0:7> to select word lines of the corresponding one of the first to fourth redundancy memory cell array units 52000~52003.

The device further comprises: a column address buffer unit 32000 for receiving address signals A<0:7> from the address buffer unit 10000 and for generating column address data signals BYB<0:7>; first to fourth column predecoder units 34000~34003 each for receiving the column address data signal BYB<0:7> from the column address buffer unit 32000 and for generating decoded signals; and first to fourth column decoder units 36000~36003 each for receiving signals from the corresponding one of the first to fourth column predecoder units 34000–34003 and for generating signals YS<0:255> to select bit lines of the normal memory cell array unit 50000 and outputting the signals YS<0;255> to the corresponding one of the first to fourth sense amplification and I/O control units 54000~54003.

The device further comprises: a column redundancy buffer unit 33000 for receiving the column address signal A<10> from the address buffer unit 10000 and the first test mode signal TRACT from the test mode control unit 30000 and for generating a column redundancy address signal TBX10; first to fourth column redundancy predecoder units 38000~38003 each for receiving the column address data signal BYB<0:7> from the column address buffer unit 32000, the first test mode signal TRACT from the test mode control unit 30000 and the column redundancy address signal TBY10 from the column redundancy address buffer unit 33000 and for generating decoded signals TYREB<0:1>; first to fourth column redundancy fuse units 40000~40003 each for generating programmed column redundancy data signals YREB<0:1>; and first to fourth column redundancy enable signal generating units 42000~42003 each for receiving the decoded signals TYREB <0:1> from the corresponding one of the first to fourth column redundancy predecoder units 38000~38003 and the programmed column redundancy data signals YREB<0:1> from the corresponding one of the first to fourth column redundancy fuse units 40000~40003 and for generating signals RYS<0:1> to select bit lines of the corresponding one of the first to fourth redundancy memory cell array units 52000~52003 and outputting the generated signals to the corresponding one of the first to fourth sense amplification units and I/O control units 54000~54003.

The device further comprises: a bank address buffer unit 70000 for receiving address signals A12, A13 from an outside source and a bank control unit 71000 for receiving the address signals A12, A13 from the bank address buffer unit 70000 and the second test signal TPARA from the test mode control unit 30000 and for generating bank control signals BA0~BA3 to control operations of the first to fourth row predecoder units 16000~16003, of the first to fourth row redundancy predecoder units 20000~20003, of the first to fourth column predecoder units 34000~34003 and of the first to fourth column redundancy predecoder units 38000~38003.

In the second embodiment, all other parts have the same structure and operations as those in FIG. 9, except for the bank address buffer unit 70000, the bank control unit 71000 and the test mode control unit 30000.

According to the second embodiment of the present invention as illustrated in FIG. 21, 4 memory banks are selected by 2 bank address data. In the memory having a bank address such as synchronorth memory, memory areas are separated by bank address data. That is, 4 memory areas are separated according to 2 bank address data.

Referring to FIG. 21, 2 address data A12, A13 carrying bank address data are received by the bank address buffer unit 70000. The bank control unit 71000, which receives the address signals A12, A13 from the bank address buffer unit 70000 and the second test mode signal TPARA from the test mode control unit 30000, decodes the address signals A12, A13 when the second test mode signal TPARA is 'low' (not in a test mode) and generates bank control signals BA0~BA3 to select one from the following: a first memory bank comprising the first normal memory cell array unit 50000 and the first redundancy memory cell array unit 52000, a second memory bank comprising the second normal memory cell array unit 50001 and the second redundancy memory cell array unit 52001, a third memory bank comprising the third normal memory cell array unit 52002 and the third redundancy memory cell array unit 52002 and a fourth memory bank comprising the fourth normal memory cell array unit 50003 and the fourth redundancy memory cell array unit 52003. Here, the operation of selecting one of the first to fourth memory banks is performed by selectively controlling the first to fourth row predecoder units 16000~16003, the first to fourth row redundancy predecoder units 20000~20003, the first to fourth column predecoder units 34000~34003 and the first to fourth column redundancy predecoder units 38000~38003 using the bank control signals BA0~BA3. The test mode control unit 30000 generates the first test mode signal TRACT and the second test mode signal TPARA each having a 'high' level in a test mode.

When the second test mode signal TRARA is 'high' (in a test mode), the bank control signals BA0~BA3 generated at the bank control unit 71000 become 'high', thereby operating the first to fourth memory banks separated into 4. That is, in dealing with word lines, word lines of the first to fourth memory banks are simultaneously moved so as to select 4 word lines. In dealing with bit lines, bit lines of the first to fourth memory banks are simultaneously moved, thereby selecting 4 bit lines. Thereafter, 16 data outputted in each bank are processed in accordance with an exclusive-NOR operation and are compared, whereby the compared data are input and output to I/O lines. That is, I/O data of 4 banks correspond to 4 I/O to carry out input and output operations.

When the second test mode signal TPARA becomes 'high', all the bank control signals BA0~BA3 become 'high' and thereby move all memory banks. Therefore, the bank address applied from the outside becomes insignificant. As a result, in a test mode (TRACT=TPARA='high'), normal word lines and redundancy word lines are selected by A12 address data in a row operation and by A10 address data in a column operation.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device having a redundancy circuit, the device comprising:

a normal memory cell array unit;

a redundancy memory cell array unit for recovering defective cells of the normal memory cell array unit;

a test mode signal generating unit for generating a test mode signal indicating a test operation;

a row address counter unit for receiving the test mode signal, a first signal enabled in a refresh mode and a second signal toggling once in a refresh mode and for generating a row address counter signal;

a row counter reset unit for receiving the test mode signal and a part of the row address counter signal and for generating a reset signal to reset the row address counter unit;

a row counter reset initialization unit for receiving the test mode signal and for generating an initialization signal to initialize the row counter reset unit;

a row address buffer unit for receiving the row address counter signal and a row address signal from a general address buffer and for generating a row address data signal;

row predecoder and decoder units for receiving the row address data signal and for generating a signal to select word lines of the normal memory cell array unit;

a row redundancy address buffer unit for receiving a highest row address signal from the general address buffer, the test mode signal, and the row address counter signal and for generating a row redundancy address signal;

row redundancy predecoder and decoder units for receiving the row address data signal, the test mode signal and the row redundancy address signal and for generating a signal to select redundancy word lines of the redundancy memory cell array unit;

a column address buffer unit for receiving a column address signal from the general address buffer and for generating a column address data signal;

column predecoder and decoder units for receiving the column address data signal and for generating a signal to select column lines of the normal memory cell array unit;

a column redundancy address buffer unit for receiving a highest column address signal from the general address buffer and the test mode signal and for generating a column redundancy address signal; and column redundancy predecoder and decoder units for receiving the column address data signal, the test mode signal and the column redundancy address signal and for generating a signal to select redundancy column lines of the redundancy memory cell array unit.

2. The semiconductor memory device according to claim 1, wherein the test mode signal generating unit comprises:

a command buffer unit for receiving a command signal from an outside source;

a command control unit for controlling operations by the command signal received from the command buffer unit; and a test mode control unit for receiving a signal output from the command control unit and for generating the test mode signal.

3. The semiconductor memory device according to claim 1, wherein the row address counter unit comprises:

a first counter register for receiving a source voltage VCC as a carry signal, the second signal from the row address counter unit as a toggle signal, and the reset signal from the row counter reset unit as a reset input signal and for generating a row address counter signal AR<0> and a carry signal CA<0>;

a second counter register for receiving the carry signal CA<0> generated at the first counter terminal as a carry signal, the second signal from the row address counter unit as a toggle signal and the reset signal from the row counter reset unit as a reset input signal and for generating a row address counter signal AR<1> and a carry signal CA<1>;

an n−1 counter register for receiving the carry signal CA<0–2> generated at an n−2 counter register as a carry signal, the second signal from the row address counter unit as a toggle signal, and the reset signal from the row counter reset unit as a reset input signal and for generating a row address counter signal AR<n−1> and a carry signal CA<n−1>; and an n counter register for receiving the carry signal CA<n−1> as a carry signal, the second signal from the row address counter unit as a toggle signal, the reset signal from the row counter reset unit as a reset input signal, and the first signal from the row address counter unit and the test mode signal as control signals and for generating a row address counter signal AR<n>.

4. The semiconductor memory device according to claim 3, wherein each of the first to n−1 counter registers comprises:

a first NAND gate for receiving the second signal and the corresponding carry signal and for outputting a signal generated according to a NAND logic operation;

a first inverter for receiving and inverting the signal output from the first NAND gate and for outputting the inverted signal;

a first clock inverter for transmitting a signal of a first node to a second node based on the signal output from the first inverter and the signal output from the first NAND gate;

a second inverter for receiving and inverting a signal of the second node and for outputting the inverted signal to a third node;

a second clock inverter for receiving and inverting a signal of the third node under control of the signal output from the second inverter and the signal output from the first NAND gate and for outputting the inverted signal to the second node;

a third clock inverter for receiving and inverting the signal of the third node under control of the signal output from the first inverter and the signal output from the first NAND gate and for outputting the inverted signal to a fourth node;

a third inverter for receiving and inverting a signal of the fourth node and for outputting the inverted signal to a fifth node;

a fourth clock inverter for receiving and inverting a signal of the fifth node under control of the signal output from the first inverter and the signal output from the first NAND gate and for outputting the inverted signal to the fourth node;

a second NAND gate for receiving the signal of the fifth node and the corresponding carry signal and for outputting a signal generated according to a NAND logic operation;

a fourth inverter for receiving and inverting the signal output from the second NAND gate and for outputting the inverted signal;

a fifth inverter for receiving and inverting the signal of the third node and for outputting the inverted signal;

a sixth inverter for receiving and inverting the signal output from the fifth inverter and for outputting the inverted signal;

a seventh inverter for receiving and inverting the signal of the fifth node and for outputting the inverted signal to the first node; and a PMOS transistor for transmitting the source voltage Vcc to the fifth node based on the reset signal output from the row counter reset unit.

5. The semiconductor memory device according to claim 3, wherein the n counter register comprises:

a first inverter for receiving and inverting the test mode signal and for outputting the inverted signal;

a first NAND gate for receiving the signal output from the first inverter and the first signal from the row address counter unit and for outputting a signal generated according to a NAND logic operation;

a second NAND gate for receiving the signal output from the first NAND gate, the second signal from the row address counter unit and the corresponding carry signal and for outputting a signal generated according to a NAND logic operation;

a second inverter for receiving and inverting the signal output from the second NAND gate and for outputting the inverted signal;

a first clock inverter for transmitting a signal of a first node to a second node based on the signal output from the second inverter and the signal output from the second NAND gate;

a third inverter for receiving and inverting a signal of the second node and for outputting the inverted signal to a third node;

a second clock inverter for receiving and inverting a signal of the third node based on the signal output from the third inverter and the signal output from the second NAND) gate and for outputting the inverted signal to the second node;

a third clock inverter for receiving and inverting the signal of the third node based on the signal output from the second inverter and the signal output from the first NAND gate and for outputting the inverted signal to a fourth node;

a fourth inverter for receiving and inverting a signal of the fourth node and for outputting the inverted signal to a fifth node;

a fourth clock inverter for receiving and inverting a signal of the fifth node based on the signal output from the second inverter and the signal output from the second NAND gate and for outputting the inverted signal to the fourth node;

a third NAND gate for receiving the signal of the fifth node and the corresponding carry signal and for outputting a signal generated according to a NAND logic operation;

a fifth inverter for receiving and inverting the signal output from the third NAND gate and for outputting the inverted signal;

a sixth inverter for receiving and inverting the signal of the third node and for outputting the inverted signal;

a seventh inverter for receiving and inverting the signal output from the sixth inverter and for outputting the inverted signal;

an eighth inverter for receiving and inverting the signal of the fifth node and for outputting the inverted signal to the first node; and a PMOS transistor for transmitting the source voltage Vcc to the fifth node using the reset signal from the row counter reset unit.

6. The semiconductor memory device circuit according to claim 1, wherein the row counter reset unit performs a first refresh operation on the normal memory cell array unit by using a first potential level of the highest row address counter signal in a test mode, and when the first refresh operation is finished, the row counter reset unit performs a second refresh operation on the redundancy memory cell array unit using a second potential level of the highest row address counter signal, and generates a reset signal to reset the row address counter unit.

7. The semiconductor memory device circuit according to claim 6, wherein the row counter reset unit comprises:

a first NAND gate for receiving the lowest row address counter signal and the second lowest row address counter signal from the row address counter unit and for outputting a signal generated according to a NAND logic operation;

a first inverter for receiving and inverting the signal output from the first NAND gate and for outputting the inverted signal;

a second NAND gate for receiving the third lowest row address counter signal and the highest row address counter signal from the row address counter unit and for outputting a signal generated according to a NAND logic operation;

a second inverter for receiving and inverting the signal output from the second NAND gate and for outputting the inverted signal;

a third NAND gate for receiving the signal output from the first inverter and the signal output from the second inverter and for outputting a signal generated according to a NAND logic operation;

a third inverter for receiving and inverting the signal output from the third NAND gate and for outputting the inverted signal to a first node;

a fourth inverter for receiving, and inverting the second signal from the row address counter unit and for outputting the inverted signal;

a first clock inverter for receiving and inverting a signal of the first node based on the second signal and the signal output from the fourth inverter and for outputting the inverted signal to a second node;

a fourth NAND gate for receiving a signal of the second node and the initialization signal from the row counter reset initialization unit and for outputting a signal generated according to a NAND logic operation to a third node;

a second clock inverter for receiving and inverting a signal of the third node based on the second signal and signal output from the fourth inverter and for outputting the inverted signal to the second node;

a fifth NAND gate for receiving the second signal, the signal of the third node and the test mode signal and for outputting a signal generated according to a NAND logic operation;

a fifth inverter for receiving and inverting the signal output from the fifth NAND gate and for outputting the inverted signal; and a sixth inverter for receiving and inverting the signal output from the fifth inverter and for generating an inverted row counter reset signal.

8. The semiconductor memory device according to claim 1, wherein the row counter reset initialization unit comprises:

a first inverter for receiving and inverting the test mode signal and for outputting the inverted signal;

a delay terminal for receiving and delaying the signal output from the first inverter and for outputting a delayed signal;

a second inverter for receiving and inverting the signal output from the delay terminal and for outputting the inverted signal;

a NOR gate for receiving the signal output from the first inverter and the signal output from the second inverter and for outputting a signal generated according to a NOR logic operation; and a third inverter for generating the initialization signal by inverting the signal output from the NOR gate.

9. The semiconductor memory device according to claim 8, wherein the first control signal is enabled in other operations except during a refresh operation and the second control signal is enabled in a refresh operation.

10. The semiconductor memory device according to claim 1, wherein the row redundancy address buffer unit comprises:
- a first inverter for receiving and inverting the first signal from the row address counter unit and for outputting the inverted signal;
- a first NOR gate for receiving the signal output from the first inverter and the test mode signal from the test mode control unit and for outputting a signal generated according to a NOR logic operation;
- a first NMOS transistor for discharging electric potential of a first node to a ground voltage Vss due to a signal received from the first NOR gate, the first node receiving a highest row address signal from the general address buffer;
- a first PMOS transistor for transmitting a source voltage Vcc to a second node when a signal of the first node is at a low level;
- a second PMOS transistor connected to the first PMOS transistor in a row and receiving the source voltage Vcc at its gate;
- second and third NMOS transistors connected between the second node and the ground voltage Vss, their operation being controlled by the source voltage Vcc and by a signal of the first node;
- a first clock inverter for receiving and inverting a signal of the second node by a first control signal and for outputting the inverted signal to a third node;
- a second inverter for receiving and inverting a signal of the third node and for outputting the inverted signal to a fourth node;
- a third inverter for receiving and inverting a signal of the fourth node and for outputting the inverted signal to the third node;
- a second clock inverter for outputting to the third node a highest row address counter signal received from the row address counter unit based on a second control signal;
- a second NOR gate for receiving a signal of the third node and the ground voltage Vss and for outputting a signal generated according to a NOR logic operation;
- a fourth inverter for inverting the signal output from the second NOR gate and for outputting a row redundancy address signal;
- third and fourth PMOS transistors connected between the source voltage Vcc and a fifth node in series, their operation being controlled by the ground voltage Vss and by the signal of the fourth node;
- a fourth NMOS transistor connected between the fifth node and a sixth node, its operation being controlled by the signal of the fourth node;
- a fifth inverter for receiving and inverting the first signal from the row address counter unit and for outputting the inverted signal;
- a sixth inverter for inverting and outputting a signal received from the fifth inverter;
- a third NOR gate for receiving the signal output from the sixth inverter and the ground voltage Vss and for outputting a signal generated according to a NOR logic operation;
- a fifth PMOS transistor connected between the source voltage Vcc and the fifth node and receiving the signal output from the third NOR gate at its gate;
- fifth and sixth NMOS transistors connected between the fifth node and the ground voltage Vss in series, their operation being controlled by the ground voltage Vss and by the signal output from the third NOR gate; and
- a seventh inverter for inverting a signal received from the fifth node and for outputting the row address data signal.

11. The semiconductor memory device according to claim 10, wherein the first control signal is enabled in other operations except for a refresh operation and the second control signal is enabled in the refresh operation.

12. The semiconductor memory device according to claim 1, wherein the row redundancy predecoder unit comprises:
- a first inverter for receiving and inverting a first row address data signal received from the row address buffer unit and for outputting the inverted signal;
- a second inverter for inverting and outputting the signal output from the first inverter;
- a third inverter for receiving and inverting a second row address data signal received from the row address buffer unit and for outputting the inverted signal;
- a fourth inverter for inverting and outputting the signal output from the third inverter;
- a fifth inverter for receiving a third row address data signal received from the row address buffer unit and for outputting the inverted signal;
- a sixth inverter for inverting and outputting the signal output from the fifth inverter;
- a first NAND gate for receiving signals from the first, the third and the fifth inverters and for outputting a signal generated according to a NAND logic operation;
- a second NAND gate for receiving signals from the second, the fourth and the sixth inverters and for outputting a signal generated according to a NAND logic operation;
- a third NAND gate for receiving signals from the first, the fourth and the fifth inverters and for outputting a signal generated according to a NAND logic operation;
- a fourth NAND gate for receiving signals from the second, the fourth and the fifth inverters and for outputting a signal generated according to a NAND logic operation;
- a fifth NAND gate for receiving signals from the first, the fourth and the sixth inverters and for outputting a signal generated according to a NAND logic operation;
- a sixth NAND gate for receiving signals from the second, the fourth and the sixth inverters and for outputting a signal generated according to a NAND logic operation;
- a seventh NAND gate for receiving signals from the first, the fourth and the sixth inverters and for outputting a signal generated according to a NAND logic operation;
- an eighth NAND gate for receiving signals from the second, the fourth and the sixth inverters and for outputting a signal generated according to a NAND logic operation;
- a ninth NAND gate for receiving the test mode signal from the test mode control unit and row redundancy address signal from the row redundancy address buffer unit and for outputting a signal generated according to a NAND logic operation;
- a seventh inverter for receiving and inverting the signal output from the ninth NAND gate and for outputting the inverted signal;
- an eighth inverter for receiving and inverting the signal output from the seventh inverter and for outputting the inverted signal;

a first NOR gate for receiving and inverting the signal output from the first NAND gate and the signal output from the eighth inverter and for outputting a signal generated according to a NOR logic operation;

a ninth inverter for inverting the signal output from the first NOR gate and for outputting a highest row redundancy predecoding signal;

a second NOR gate for receiving the signal output from the second NAND gate and the signal output from the eighth inverter and for outputting a signal generated according to a NOR logic operation;

a tenth inverter for inverting the signal output from the second NOR gate and for outputting a row redundancy predecoding signal;

a third NOR gate for receiving the signal output from the third NAND gate and the signal output from the eighth inverter and for a outputting signal generated according to a NOR logic operation;

an eleventh inverter for inverting the signal output from the third NOR gate and for outputting a row redundancy predecoding signal;

a fourth NOR gate for receiving the signal output from the fourth NAND gate and the signal output from the eighth inverter and for outputting a signal generated according to a NOR logic operation;

a twelfth inverter for inverting the signal output from the fourth NOR gate and for outputting a row redundancy predecoding signal;

a fifth NOR gate for receiving the signal output from the fifth NAND gate and the signal output from the eighth inverter and for outputting a signal generated according to a NOR logic operation;

a thirteenth inverter for inverting the signal output received from the fifth NOR gate and for outputting a row redundancy predecoding signal;

a sixth NOR gate for receiving the signal output from the sixth NAND gate and the signal output from the eight inverter and for outputting a signal generated according to a NOR logic operation;

a fourteenth inverter for inverting the signal output from the sixth NOR gate and for outputting a row redundancy predecoding signal;

a seventh NOR gate for receiving the signal output from the seventh NAND gate and the signal output from the eighth inverter and for outputting a signal generated according to a NOR logic operation;

a fifteenth inverter for inverting the signal output from the seventh NOR gate and for outputting a row redundancy predecoding signal;

an eighth NOR gate for receiving the signal output from the eighth NAND gate and the signal output from the eighth inverter and for outputting a signal generated according to a NOR logic operation; and a sixteenth inverter for inverting the signal output from the eighth NOR gate and for outputting a lowest row redundancy predecoding signal.

13. The semiconductor memory device according to claim 1, wherein the column redundancy address buffer unit comprises:

a first inverter for receiving and inverting the test mode signal from the test mode control unit and for outputting the inverted signal;

a first NOR gate for receiving the signal output from a first inverter and a first control signal and for outputting a signal generated according to a NOR logic operation;

a first PMOS transistor for transmitting a source voltage Vcc to a first node by using a highest column address signal;

a second PMOS transistor for transmitting the source voltage Vcc to the first node based on a signal received from the first NOR gate;

first and second NMOS transistors connected between the first node and ground voltage Vss in series, their operation being controlled by an output signal of the first NOR gate and by a signal received from the general address buffer;

a first clock inverter for transmitting a signal of the first node to a second node using a second control signal;

a second inverter for receiving and inverting a signal of the second node and for outputting the inverted signal to a third node;

a second clock inverter for transmitting a signal of the third node to the second node by using the second control signal; and a third inverter for inverting the signal of the second node and for outputting a column redundancy address signal.

14. The semiconductor memory device according to claim 13, wherein the first control signal controls to receive the highest column address signal and the second control signal controls to transmit the highest column address signal received to the first node in a column operation to the second node.

15. The semiconductor memory device according to claim 1, wherein the column redundancy predecoder unit comprises:

a first NAND gate for receiving the test mode signal from the test mode control unit and a highest column redundancy address signal from the column redundancy address buffer unit and for outputting a signal generated according to a NAND logic operation;

a first inverter for receiving and inverting the signal output from the first NAND gate and for outputting the inverted signal;

a second inverter for receiving and inverting the column address data signal from the column address buffer unit and for outputting the inverted signal;

a second NAND gate for receiving the signal output from the second inverter and the signal output from the first inverter and for outputting a signal generated according to a NAND logic operation;

a third inverter for receiving and inverting the signal output from the second NAND gate and for outputting the inverted signal;

a fourth inverter for inverting the signal output received from the third inverter and for outputting a first column redundancy predecoding signal;

a third inverter for receiving and inverting the signal output from the second inverter and for outputting the inverted signal;

a third NAND gate for receiving the signal output from the third inverter and the signal output from the first inverter and for outputting a signal generated according to a NAND logic operation;

a sixth inverter for receiving and inverting the signal output from the third NAND gate and for outputting the inverted signal; and a seventh inverter for inverting the signal output from the sixth inverter and for outputting a second column redundancy predecoding signal.

16. The semiconductor memory device having a redundancy circuit, comprising:

a normal memory cell array unit comprising N memory banks for storing a plurality of data;

a redundancy memory cell array unit comprising N memory banks for recovering defective cells of the normal memory cell array unit;

a test mode signal generating unit for generating a test mode signal indicating a test operation;

a row address counter unit for receiving the test mode signal, a first signal enabled in a refresh mode and a second signal toggling once in a refresh mode and for generating a row address counter signal;

a row counter reset unit for receiving the test mode signal, the second signal and a part of the row address counter signal and for generating a reset signal to reset the row address counter unit;

a row counter reset initialization unit for receiving the test mode signal and for generating an initialization signal to initialize the row counter reset unit;

a row address buffer unit for receiving the row address counter signal and a row address signal from an address source and for generating a row address data signal;

N row predecoder and decoder units for receiving the row address data signal and for generating a signal to select word lines of the normal memory cell array unit;

a row redundancy address buffer unit for receiving a highest row address signal from the address source, the test mode signal and the row address counter signal and for generating a row redundancy address signal;

N row redundancy predecoder and decoder units for receiving the row address data signal, the test mode signal and the row redundancy address signal and for generating a signal to select redundancy word lines of the redundancy memory cell array unit;

a column address buffer unit for receiving a column address signal from the address source and for generating a column address data signal;

N column predecoder and decoder units for receiving the column address data signal and for generating a signal to select column lines of the normal memory cell array unit;

a column redundancy address buffer unit for receiving a highest column address signal from the address source and the test mode signal and for generating a column redundancy address signal;

N column redundancy predecoder and decoder units for receiving the column address data signal, the test mode signal and the column redundancy address signal and for generating a signal to select redundancy column lines of the redundancy memory cell array unit;

a bank address buffer unit for receiving an address signal having address data of the memory banks; and a bank control unit for generating a signal to selectively control the operations of the N row predecoder and decoder units, the N row redundancy predecoder and decoder units, the N column predecoder and decoder units and N column redundancy predecoder and decoder units by using a decoding address signal received from the bank address buffer unit based on the test mode signal.

17. The semiconductor memory device having the redundancy circuit according to claim 16, wherein the test mode signal generating unit comprises:

a command buffer unit for receiving command signals from an outside source;

a command control unit for controlling operations of the device based on the command signals received from the command buffer unit; and a test mode control unit for receiving a signal from the command control unit and for generating the test mode signal.

18. The semiconductor memory device having the redundancy circuit according to claim 16, wherein the row address counter unit comprises:

a first counter for receiving a source voltage Vcc as a carry signal, the second signal from the row address counter unit as a toggling signal and the reset signal from the row counter reset unit as a reset input signal and for generating a row address counter signal AR<0> and a carry signal CA<0>;

a second counter for receiving the carry signal CA<0> generated at the first counter as a carry signal, the second signal as a toggle signal and the reset signal from the row counter reset unit as a reset input signal and for outputting a row address counter signal AR<0> and a carry signal CA<1>;

an n−1 counter for receiving the carry signal CA<n−2> generated at an n−2 counter as a carry signal, the second signal as a toggle signal and the reset signal from the row counter reset unit as a reset input signal and for generating a row address counter signal AR<n−1> and a carry signal CA<n−1>; and an n counter for receiving the carry signal CA<n−1> generated at the n−1 counter as a carry signal, the second signal as a toggle signal, the reset signal from the row counter reset unit as a reset input signal, and the first signal and the test mode signal as control signals and for generating a row address counter signal AR<n>.

19. The semiconductor memory device having the redundancy circuit according to claim 18, wherein each of the first to n−1 counters comprises:

a first NAND gate for receiving the second signal and the corresponding carry signal and for outputting a signal generated according to a NAND logic operation;

a first inverter for receiving and inverting the signal output from the first NAND gate and for outputting the inverted signal;

a first clock inverter for transmitting a signal of a first node to a second node based on the signal output from the first inverter and the signal output from the first NAND gate;

a second inverter for receiving and inverting a signal of the second node and for outputting the inverted signal to a third node;

a second clock inverter for receiving and inverting a signal of the third node based on the signal output from the second inverter and the signal output from the first NAND gate and for outputting the inverted signal to the second node;

a third clock inverter for receiving and inverting a signal of the third node based on the signal output from the first inverter and the signal output from the first NAND gate and for outputting the inverted signal to a fourth node;

a third inverter for receiving and inverting a signal of the fourth node and for outputting the inverted signal to a fifth node;

a fourth clock inverter for receiving and inverting a signal of the fifth node based on the signal output from the first inverter and the signal output from the first NAND gate and for outputting the inverted signal to the fourth node;

a second NAND gate for receiving and inverting the signal of the fifth node and the corresponding carry signal and for outputting a signal generated according to a NAND logic operation;

a fourth inverter for receiving and inverting the signal output from the second NAND gate and for outputting the inverted signal;

a fifth inverter for receiving and inverting the signal of the third node and for outputting the inverted signal;

a sixth inverter for receiving and inverting the signal output from the fifth inverter and for outputting the inverted signal;

a seventh inverter for receiving and inverting the signal of the fifth node and for outputting the inverted signal to the first node; and a PMOS transistor for transmitting a source voltage Vcc to the fifth node by the reset signal from the row counter reset unit.

20. The semiconductor memory device having the redundancy circuit according to claim 18, wherein the n counter comprises:

a first inverter for receiving and inverting the test mode signal and for outputting the inverted signal;

a first NAND gate for receiving the signal output from the first inverter and the first signal from the row address counter unit and for outputting a signal generated according to a NAND logic operation;

a second NAND gate for receiving the signal output from the first NAND gate, the second signal from the row address counter unit and the corresponding carry signal and for outputting a signal generated according to a NAND logic operation;

a second inverter for receiving and inverting the signal output from the second NAND gate and for outputting the inverted signal;

a first clock inverter for transmitting a signal of a first node to a second node based on the signal output from the second inverter and the signal output from the second NAND gate;

a third inverter for receiving and inverting a signal of the second node and for outputting the inverted signal to a third node;

a second clock inverter for receiving and inverting a signal of the third node based on the signal output from the third inverter and the signal output from the second NAND gate and for outputting the inverted signal to the second node;

a third clock inverter for receiving and inverting the signal of the third node based on the signal output from the second inverter and the signal output from the first NAND gate and for outputting the inverted signal to the fourth node;

a fourth inverter for receiving and inverting a signal of the fourth node and for outputting the inverted signal to a fifth node;

a fourth clock inverter for receiving and inverting a signal of the fifth node based on the signal output from the second inverter and the signal output from the second NAND gate and for outputting the inverted signal to the fourth node;

a third NAND gate for receiving the signal of the fifth node and the corresponding carry signal and for outputting a signal generated according to a NAND logic operation;

a fifth inverter for receiving and inverting the signal output from the third NAND gate and for outputting the inverted signal;

a sixth inverter for receiving and inverting the signal output from the third node and for outputting the inverted signal;

a seventh inverter for receiving and inverting the signal output from the sixth inverter and for outputting the inverted signal;

an eighth inverter for receiving and inverting the signal of the fifth node and for outputting the inverted signal to the first node; and a PMOS transistor for transmitting a source voltage Vcc to the fifth node by the reset signal from the row counter reset unit.

21. The semiconductor memory device having the redundancy circuit according to a claim 16, wherein the row counter reset unit performs a refresh operation on the normal memory cell array unit by using a first potential level of a highest row address counter signal in a test mode, and when the refresh operation for the redundancy memory cell array unit is finished by using a second potential level of the highest row address counter signal, the row counter reset unit generates the reset signal to reset the row address counter unit.

22. The semiconductor memory device having the redundancy circuit according to claim 21, wherein the first potential level is at a low level and the second potential level is at a high level.

23. The semiconductor memory device having the redundancy circuit according to claim 21, wherein the row counter reset unit comprises:

a first NAND gate for receiving a lowest row address counter signal and a second lowest row address counter signal from the row address counter unit and for outputting a signal generated according to a NAND logic operation;

a first inverter for receiving and inverting the signal output from the first NAND gate and for outputting the inverted signal;

a second NAND gate for receiving a third lowest row address counter signal and the highest row address counter signal from the row address counter unit and for outputting a signal generated according to a NAND logic operation;

a second inverter for receiving and inverting the signal output from the second NAND gate and for outputting the inverted signal;

a third NAND gate for receiving the signal output from the first inverter and the signal output from the second inverter and for outputting a signal generated according to a NAND logic operation;

a third inverter for receiving and inverting the signal output from the third NAND gate and for outputting the inverted signal to a first node;

a fourth inverter for receiving and inverting the second signal from the row address counter unit and for outputting the inverted signal;

a first clock inverter for receiving and inverting a signal of the first node based on the second signal and the signal output from the fourth inverter and for outputting the inverted signal to a second node;

a fourth NAND gate for receiving a signal of the second node and the initialization signal from the row counter reset initialization unit and for outputting a signal generated according to a NAND logic operation to a third node;

a second clock inverter for receiving and inverting a signal of the third node based on the second signal and the signal output from the fourth inverter and for outputting the inverted signal to the second node;

a fifth NAND gate for receiving the second signal, the signal of the third node and the test mode signal and for outputting a signal generated according to a NAND logic operation;

a fifth inverter for receiving and inverting the signal output from the fifth NAND gate and for outputting the inverted signal; and a sixth inverter for receiving and inverting the signal output from the fifth inverter and for generating an inverted row counter reset signal.

24. The semiconductor memory device having the redundancy circuit according to claim 16, wherein the row counter reset initialization unit comprises:

a first inverter for receiving and inverting the test mode signal and for outputting the inverted signal;

a delay terminal for receiving and delaying the signal output from the first inverter and for outputting a delayed signal;

a second inverter for receiving and inverting the delayed signal from the delay terminal and for outputting the inverted signal;

a NOR gate for receiving the signal output from the first inverter and the signal output from the second inverter and for outputting a signal generated according to a NOR logic operation; and a third inverter for inverting the signal output from the NOR gate and for generating the initialization signal.

25. The semiconductor memory device having the redundancy circuit according to claim 16, wherein the row address buffer unit comprises:

a first inverter for receiving and inverting the first signal and for outputting the inverted signal;

a second inverter for receiving and inverting the signal output from the first inverter and for outputting the inverted signal;

a first NMOS transistor for discharging potential of a first node to a ground voltage Vss, wherein the first node receives the highest row address signal from the address source based on the signal output from the second inverter;

a first PMOS transistor for transmitting a source voltage Vcc to a second node when a signal of the firs node is at a low level;

a second PMOS transistor connected to the first PMOS transistor in a row and receiving the source voltage Vcc at its gate;

second and third NMOS transistors connected between the second node and the ground voltage Vss, their operation being controlled by the source voltage Vcc and by a signal of the first node;

a first clock inverter for receiving and inverting a signal of the second node by a first control signal and for outputting the inverted signal to a third node;

a third inverter for receiving and inverting a signal of the third node and for outputting the inverted signal to a fourth node;

a fourth inverter for receiving and inverting a signal of the fourth node and for outputting the inverted signal to the third node;

a second clock inverter for outputting to the third node the highest row address signal received from the row address counter unit based on a second control signal;

third and fourth PMOS transistors connected between the source voltage Vcc and a fifth node in series, their operation being controlled by the ground voltage Vss and by the signal of the fourth node;

a fourth NMOS transistor connected between the fifth node and a sixth node, its operation being controlled by the signal of the fourth node;

a fifth inverter for receiving and inverting the first signal and for outputting the inverted signal;

a sixth inverter for inverting and outputting a signal received from the fifth inverter;

a third NOR gate for inputting the signal output from the sixth inverter and the ground voltage Vss and for outputting a signal generated according to a NOR logic operation;

a fifth PMOS transistor connected between the source voltage Vcc and the fifth node and receiving the signal output from the third NOR gate;

fifth and sixth NMOS transistors connected between the fifth node and the ground voltage Vss in series, their operation being controlled by the ground voltage Vss and by the signal output from the third NOR gate; and a seventh inverter for inverting a signal received from the fifth node and for outputting the row address data signal.

26. The semiconductor memory device having the redundancy circuit according to claim 25, wherein the first control signal is enabled in other operations except for a refresh operation, and the second control signal is enabled in a refresh operation.

27. The semiconductor memory device having the redundancy circuit according to claim 16, wherein the row redundancy address buffer unit comprises:

a first inverter for receiving and inverting the first signal from the row address counter unit and for outputting the inverted signal;

a first NOR gate for receiving the signal output from the first inverter and the test mode signal from the test mode control unit and for outputting a signal generated according to a NOR logic operation;

a first NMOS transistor for discharging potential of a first node to a ground voltage Vss, wherein the first node receives the highest row address signal from the address source based on the signal output from the first NOR gate;

a first PMOS transistor for transmitting a source voltage Vcc to a second node when a signal of the first node is at a low level;

a second PMOS transistor connected to the first PMOS transistor and receiving the source voltage Vcc;

second and third NMOS transistors connected between the second node and the ground voltage Vss, their operation being controlled by the source voltage Vcc and by the signal of the first node;

a first clock inverter for receiving and inverting a signal of the second node by a first control signal and for outputting the inverted signal to a third node;

a second inverter for receiving and inverting a signal of the third node and for outputting the inverted signal to a fourth node;

a third inverter for receiving and inverting a signal of the fourth node and for outputting the inverted signal to the third node;

a second clock inverter for outputting to the third node a highest row address counter signal received from the row address counter unit by a second control signal;

a second NOR gate for receiving the signal of the third node and the ground voltage Vss and for outputting a signal generated according to a NOR logic operation;

a fourth inverter for inverting the signal output from the second NOR gate and for outputting the row redundancy address signal;

third and fourth PMOS transistors connected between the source voltage Vcc and a fifth node in series, their operation being controlled by the ground voltage Vss and by the signal of the fourth node;

a fourth NMOS transistor connected between the fifth node and a sixth node, its operation being controlled by the signal of the fourth node;

a fifth inverter for receiving and inverting the first signal and for outputting the inverted signal;

a sixth inverter for inverting and outputting a signal received from the fifth inverter;

a third NOR gate for inputting the signal output from the sixth inverter and the ground voltage Vss and for outputting a signal generated according to a NOR logic operation;

a fifth PMOS transistor connected between the source voltage Vcc and the fifth node and receiving an output signal of the third NOR gate;

fifth and sixth NMOS transistors connected between the fifth node and the ground voltage Vss in series, their operation being controlled by the ground voltage Vss and by the output signal of the third NOR gate; and a seventh inverter for inverting a signal of the fifth node and for outputting the row address data signal.

28. The semiconductor memory device having the redundancy circuit according to claim 27, wherein the first control signal is enabled in other operations except for a refresh operation, and the second control signal is enabled in a refresh operation.

29. The semiconductor memory device having the redundancy circuit according to claim 16, wherein the row redundancy predecoder unit comprises:

a first inverter for receiving and inverting a first row address data signal received from the row address buffer unit and for outputting the inverted signal;

a second inverter for inverting and outputting a signal received from the first inverter;

a third inverter for receiving and inverting a second row address data signal received from the row address buffer unit and for outputting the inverted signal;

a fourth inverter for inverting and outputting a signal received from the third inverter;

a fifth inverter for receiving and inverting a third row address data signal received from the row address buffer unit and for outputting the inverted signal;

a sixth inverter for inverting and outputting a signal received from the fifth inverter;

a first NAND gate for receiving signals from the first, the third and the fifth inverters and for outputting a signal generated according to a NAND logic operation;

a second NAND gate for receiving signals from the second, the fourth and the sixth inverters and for outputting a signal generated according to a NAND logic operation;

a third NAND gate for receiving signals form the first, the fourth and the fifth inverters and for outputting a signal generated according to a NAND logic operation;

a fourth NAND gate for receiving signals from the second, the fourth and the fifth inverters and for outputting a signal generated according to a NAND logic operation;

a fifth NAND gate for receiving signals from the first, the fourth and sixth inverters and for outputting a signal generated according to a NAND logic operation;

a sixth NAND gate for receiving signals from the second, the fourth and the sixth inverters and for outputting a signal generated according to a NAND logic operation;

a seventh NAND gate for receiving signals from the first, the fourth and the sixth inverters and for outputting a signal generated according to a NAND logic operation;

an eighth NAND gate for receiving signals from the second, the fourth and the sixth inverters and for outputting a signal generated according to a NAND logic operation;

a ninth NAND gate for receiving the test mode signal from the test mode control unit and the row redundancy address signal from the row redundancy address buffer unit and for outputting a signal generated according to a NAND logic operation;

a seventh inverter for receiving and inverting a signal from the ninth NAND gate and for outputting the inverted signal;

an eighth inverter for receiving and inverting a signal from the seventh inverter and for outputting the inverted signal;

a first NOR gate for receiving a signal from the first NAND gate and a signal from the eighth inverter and for outputting a signal generated according to a NOR logic operation;

a ninth inverter for inverting, a signal received from the first NOR gate and for outputting a highest row redundancy predecoding signal;

a second NOR gate for receiving a signal from the second NAND gate and a signal from the eighth inverter and for outputting a signal generated according to a NOR logic operation;

a tenth inverter for inverting a signal received from the second NOR gate and for outputting a row redundancy predecoding signal;

a third NOR gate for receiving a signal from the third NAND gate and a signal from the eighth inverter and for outputting a signal generated according to a NOR logic operation;

a eleventh inverter for inverting a signal received from the third NOR gate and for outputting a row redundancy predecoding signal;

a fourth NOR gate for receiving a signal from the fourth NAND gate and a signal from the eighth inverter and for outputting a signal generated according to a NOR logic operation;

a twelfth inverter for inverting a signal received from the fourth NOR gate and for outputting a row redundancy predecoding signal;

a fifth NOR gate for receiving a signal from the fifth NAND gate and a signal from the eighth inverter and for outputting a signal generated according to a NOR logic operation;

a thirteenth inverter for inverting a signal received from the fifth NOR gate and for outputting a row redundancy predecoding signal;

a sixth NOR gate for receiving a signal from the sixth NAND gate and a signal from the eighth inverter and for outputting a signal generated according to a NOR logic operation;

a fourteenth inverter for inverting a signal received from the sixth NOR gate and for outputting a row redundancy predecoding signal;

a seventh NOR gate for receiving a signal from the seventh NAND gate and a signal from the eighth inverter and for outputting a signal generated according to a NOR logic operation;

a fifteenth inverter for inverting a signal received from the seventh NOR gate and for outputting a row redundancy predecoding signal;

an eighth NOR gate for receiving a signal from the eighth NAND gate and signal from the eighth inverter and for outputting a signal generated according to a NOR logic operation; and a sixteenth inverter for inverting a signal received from the eighth NOR gate and for outputting a lowest row redundancy predecoding signal.

30. The semiconductor memory device having the redundancy circuit according to claim 16, wherein the column redundancy address buffer unit comprises:

a first inverter for receiving and inverting the test mode signal from the test mode control unit and for outputting the inverted signal;

a first NOR gate for receiving a signal from the first inverter and a first control signal and for outputting a signal generated according to a NOR logic operation;

a first PMOS transistor for transmitting a source voltage Vcc to a first node by a highest column address signal;

a second PMOS transistor for transmitting the source voltage Vcc to the first node by a signal received from the first NOR gate;

first and second NMOS transistors connected between the first node and ground voltage Vss in series, their operation being controlled by an output signal of the first NOR gate and by a signal received from the address source;

a first clock inverter for transmitting a signal of the first node to a second node based on a second control signal;

a second inverter for receiving and inverting a signal of the second node and for outputting the inverted signal to a third node;

a second clock inverter for transmitting a signal of the third node to the second node based on the second control signal; and a third inverter for inverting the signal of the second node and for outputting the column redundancy address signal.

31. The semiconductor memory device having the redundancy circuit according to claim 30, wherein the first control signal controls to receive the highest column address signal and the second control signal controls to transmit the highest column address signal received at the first node to the second node in a column operation.

32. The semiconductor memory device having the redundancy circuit according to claim 16, wherein the column redundancy predecoder unit comprises:

a first NAND gate for receiving the test mode signal from the test mode control unit and a highest column redundancy address signal from the column redundancy address buffer unit and for outputting a signal generated according to a NAND logic operation;

a first inverter for receiving and inverting a signal from the first NAND gate and for outputting the inverted signal;

a second inverter for receiving and inverting the column address data signal from the column address buffer unit and for outputting the inverted signal;

a second NAND gate for receiving a signal from the second inverter and a signal from the first inverter and for outputting a signal generated according to a NAND logic operation;

a third inverter for receiving and inverting a signal from the second NAND gate and for outputting the inverted signal;

a fourth inverter for inverting a signal received from the third inverter and for outputting a first column redundancy predecoding signal;

a third inverter for receiving and inverting a signal from the second inverter and for outputting the inverted signal;

a third NAND gate for receiving a signal from the third inverter and a signal from the first inverter and for outputting a signal generated according to a NAND logic operation;

a sixth inverter for receiving and inverting a signal from the third NAND gate and for outputting the inverted signal; and a seventh inverter for inverting a signal received from the sixth inverter and for outputting a second column redundancy predecoding signal.

* * * * *